(12) United States Patent
Thomas et al.

(10) Patent No.: US 8,726,424 B2
(45) Date of Patent: May 20, 2014

(54) ENERGY MANAGEMENT STRUCTURE

(75) Inventors: Shawn Thomas, Paniesville, OH (US); Ronald M. Szalkowski, Lakewood, OH (US); Joseph Vincent Pease, III, Lakewood, OH (US)

(73) Assignee: Intellectual Property Holdings, LLC, Cleveland, OH (US)

( * ) Notice: Subject to any disclaimer, the term of this patent is extended or adjusted under 35 U.S.C. 154(b) by 289 days.

(21) Appl. No.: 12/792,858

(22) Filed: Jun. 3, 2010

(65) Prior Publication Data

US 2011/0296594 A1 Dec. 8, 2011

(51) Int. Cl.
 *A42B 3/00* (2006.01)
(52) U.S. Cl.
 USPC .......................................................... 2/414
(58) Field of Classification Search
 USPC .................. 2/114, 169, 414, 425, 243.1, 455;
  188/371, 377; 267/142, 143, 122;
  428/166
 See application file for complete search history.

(56) References Cited

U.S. PATENT DOCUMENTS

| | | |
|---|---|---|
| 666,130 A | 1/1901 | Cole |
| 957,394 A | 5/1910 | Thoma |
| 1,012,597 A | 12/1911 | Church |
| 1,539,283 A | 5/1925 | Staats-Oels |
| 1,552,965 A | 9/1925 | Smith |
| 1,560,825 A | 11/1925 | Kelticka |
| 1,958,050 A | 5/1934 | Koppelman |
| 2,074,331 A | 3/1937 | Haider |
| 2,090,881 A | 8/1937 | Wilson |
| 2,221,310 A | 11/1940 | Gazelle |
| 2,275,575 A | 3/1942 | Vrooman |
| 2,285,335 A | 6/1942 | Hurt |
| 2,303,744 A | 12/1942 | Jacobs |
| 2,311,373 A | 2/1943 | Durning |
| 2,318,077 A | 5/1943 | Jonas |
| 2,346,161 A | 4/1944 | Grant |
| 2,349,907 A | 5/1944 | Kos |
| 2,433,012 A | 12/1947 | Zalicovitz |
| 2,434,641 A | 1/1948 | Burns |
| 2,711,033 A | 6/1955 | Dick |

(Continued)

FOREIGN PATENT DOCUMENTS

| | | |
|---|---|---|
| CA | 2598015 | 8/2006 |
| CA | 2663728 | 9/2008 |

(Continued)

OTHER PUBLICATIONS

The Messier Project: The M11 Helmet, www.cascadeicehockey.com/the-helmet.html (2 pages) Jan. 19, 2010.

(Continued)

*Primary Examiner* — Katherine Moran

(74) *Attorney, Agent, or Firm* — Calfee, Halter & Griswold LLP

(57) ABSTRACT

An energy management structure is adapted to absorb a force applied thereto. The structure includes a first component possessing a first compressive response profile, a second component possessing a second compressive response profile different from the first compressive response profile, and a third component connecting the first component to the second component. Upon application of a force, the second compressive response profile of the second component is additive to the first compressive response profile of the first component to result in an overall compressive response profile of the energy management structure that meets a design compressive response profile.

60 Claims, 17 Drawing Sheets

(56) References Cited

U.S. PATENT DOCUMENTS

| | | |
|---|---|---|
| 2,739,093 A | 3/1956 | Bull |
| 2,759,186 A | 8/1956 | Dye |
| 2,772,196 A | 11/1956 | Pooley |
| 2,776,452 A | 1/1957 | Chavannes |
| 2,983,056 A | 5/1961 | Murawski |
| 3,018,015 A | 1/1962 | Agriss et al. |
| 3,026,231 A | 3/1962 | Chavannes |
| 3,039,109 A | 6/1962 | Simpson |
| 3,086,899 A | 4/1963 | Smith et al. |
| 3,088,539 A | 5/1963 | Mathues et al. |
| 3,099,043 A | 7/1963 | Held |
| 3,124,807 A | 3/1964 | Frenkel et al. |
| 3,142,599 A | 7/1964 | Chavannes |
| 3,144,247 A | 8/1964 | Ehrenfried et al. |
| 3,160,963 A | 12/1964 | Aaskov |
| 3,186,013 A | 6/1965 | Glassman et al. |
| 3,195,686 A | 7/1965 | Johnson |
| 3,231,454 A | 1/1966 | Joseph |
| 3,242,500 A | 3/1966 | Derr |
| 3,251,076 A | 5/1966 | Burke |
| 3,280,410 A | 10/1966 | Propst et al. |
| 3,327,334 A | 6/1967 | Wilmanns et al. |
| 3,342,666 A | 9/1967 | Hull |
| 3,366,971 A | 2/1968 | Scherz |
| 3,378,888 A | 4/1968 | Robertson |
| 3,425,061 A | 2/1969 | Webb |
| 3,447,163 A | 6/1969 | Bothwell et al. |
| 3,484,835 A | 12/1969 | Trountine et al. |
| 3,500,472 A | 3/1970 | Castellani |
| 3,500,475 A | 3/1970 | Otsuka |
| 3,507,727 A | 4/1970 | Marshack |
| 3,508,992 A | 4/1970 | Chavannes et al. |
| 3,514,156 A | 5/1970 | Fields |
| 3,525,663 A | 8/1970 | Hale |
| 3,538,628 A | 11/1970 | Einstein, Jr. |
| 3,575,781 A | 4/1971 | Pezely |
| 3,600,714 A | 8/1971 | Cade |
| 3,608,215 A | 9/1971 | Fukuoka |
| 3,609,764 A | 10/1971 | Morgan |
| 3,618,144 A | 11/1971 | Frey et al. |
| 3,633,228 A | 1/1972 | Zysman |
| 3,668,056 A | 6/1972 | Hayes, Jr. |
| 3,668,704 A | 6/1972 | Conroy |
| 3,673,609 A | 7/1972 | De Simone |
| 3,679,166 A | 7/1972 | Sturhan |
| 3,684,235 A | 8/1972 | Schupbach |
| 3,709,967 A | 1/1973 | Held, Jr. |
| 3,716,614 A | 2/1973 | Okamoto et al. |
| 3,747,968 A | 7/1973 | Hornsby |
| 3,766,669 A | 10/1973 | Pearsall |
| 3,782,767 A | 1/1974 | Moore |
| 3,784,985 A | 1/1974 | Conroy |
| 3,806,950 A | 4/1974 | Spencer-Foote |
| 3,837,991 A | 9/1974 | Evans |
| 3,844,862 A | 10/1974 | Sauer et al. |
| 3,849,801 A | 11/1974 | Holt et al. |
| 3,853,221 A | 12/1974 | Boyd |
| 3,857,144 A | 12/1974 | Bustin |
| 3,863,909 A | 2/1975 | Weber |
| 3,871,636 A | 3/1975 | Boyle |
| 3,872,511 A | 3/1975 | Nichols |
| 3,877,076 A | 4/1975 | Summers |
| 3,882,547 A | 5/1975 | Morgan |
| 3,895,456 A | 7/1975 | Fabre |
| 3,900,222 A | 8/1975 | Muller |
| 3,911,187 A | 10/1975 | Raley |
| 3,926,463 A | 12/1975 | Landwehr |
| 3,928,881 A | 12/1975 | Bente |
| 3,933,387 A | 1/1976 | Salloum et al. |
| 3,940,529 A | 2/1976 | Hepford et al. |
| 3,940,811 A | 3/1976 | Tomikawa et al. |
| 3,952,358 A | 4/1976 | Fukuoka |
| 3,971,583 A | 7/1976 | Kornhauser |
| D241,228 S | 8/1976 | Boduch |
| 3,994,020 A | 11/1976 | Villari |
| 3,995,901 A | 12/1976 | Filbert, Jr. et al. |
| 3,997,207 A | 12/1976 | Norlin |
| 3,999,220 A | 12/1976 | Keltner |
| 4,022,505 A | 5/1977 | Saczawa, Jr. |
| 4,023,213 A | 5/1977 | Rovani |
| 4,029,350 A | 6/1977 | Goupy et al. |
| 4,029,534 A | 6/1977 | Bocks et al. |
| 4,038,700 A | 8/1977 | Gyory |
| 4,044,399 A | 8/1977 | Morton |
| 4,044,479 A | 8/1977 | Brutting |
| 4,064,565 A | 12/1977 | Griffiths |
| 4,067,063 A | 1/1978 | Ettinger |
| 4,075,717 A | 2/1978 | Lemelson |
| 4,077,393 A | 3/1978 | Mattson |
| 4,099,759 A | 7/1978 | Kornhauser |
| 4,101,983 A | 7/1978 | Dera et al. |
| 4,106,745 A | 8/1978 | Carrow |
| 4,110,857 A | 9/1978 | Banister |
| 4,114,197 A | 9/1978 | Morton |
| 4,134,156 A | 1/1979 | Gyory |
| 4,151,661 A | 5/1979 | Namba |
| 4,154,469 A | 5/1979 | Goupy et al. |
| 4,154,489 A | 5/1979 | Lyman |
| 4,170,078 A | 10/1979 | Moss |
| 4,187,620 A | 2/1980 | Selner |
| 4,190,276 A | 2/1980 | Hirano |
| 4,192,699 A | 3/1980 | Lewicki et al. |
| 4,213,202 A | 7/1980 | Larry |
| 4,223,455 A | 9/1980 | Vermeulen |
| 4,223,456 A | 9/1980 | Cohen |
| 4,236,326 A | 12/1980 | Inohara |
| 4,239,106 A | 12/1980 | Aileo |
| 4,239,476 A | 12/1980 | Somberg |
| 4,251,932 A | 2/1981 | Love |
| 4,262,433 A | 4/1981 | Hagg |
| 4,267,648 A | 5/1981 | Weisz |
| 4,279,038 A | 7/1981 | Bruckner et al. |
| 4,288,399 A | 9/1981 | Siedenstrang et al. |
| 4,290,149 A | 9/1981 | Aileo |
| 4,297,797 A | 11/1981 | Meyers |
| 4,299,038 A | 11/1981 | Epple |
| 4,302,892 A | 12/1981 | Adamik |
| 4,305,212 A | 12/1981 | Coomer |
| 4,307,471 A | 12/1981 | Lovell |
| 4,321,989 A | 3/1982 | Meinzer |
| 4,338,371 A | 7/1982 | Dawn et al. |
| 4,342,157 A | 8/1982 | Gilbert |
| 4,342,158 A | 8/1982 | McMahon |
| 4,345,338 A | 8/1982 | Frieder, Jr. et al. |
| 4,347,637 A | 9/1982 | Ardito |
| 4,352,484 A | 10/1982 | Gertz |
| 4,355,792 A | 10/1982 | Fukuda |
| 4,356,642 A | 11/1982 | Herman |
| D267,287 S | 12/1982 | Gooding |
| D267,831 S | 2/1983 | Sucato |
| 4,370,754 A | 2/1983 | Donzis |
| 4,372,058 A | 2/1983 | Stubblefield |
| 4,377,042 A | 3/1983 | Bauer |
| 4,391,048 A | 7/1983 | Lutz |
| 4,398,357 A | 8/1983 | Batra |
| 4,400,483 A | 8/1983 | Siedenstrang et al. |
| 4,400,894 A | 8/1983 | Ehrlich |
| 4,413,856 A | 11/1983 | McMahan et al. |
| 4,418,483 A | 12/1983 | Fujita |
| 4,423,000 A | 12/1983 | Teraoka |
| 4,428,306 A | 1/1984 | Dresen et al. |
| 4,432,099 A | 2/1984 | Grick et al. |
| 4,439,936 A | 4/1984 | Clarke et al. |
| 4,445,283 A | 5/1984 | Meyers |
| 4,449,307 A | 5/1984 | Stubblefield |
| 4,453,271 A | 6/1984 | Donzis |
| 4,455,765 A | 6/1984 | Sjosward |
| 4,458,430 A | 7/1984 | Peterson |
| 4,460,205 A | 7/1984 | Glance |
| 4,472,472 A | 9/1984 | Schultz |
| 4,494,320 A | 1/1985 | Davis |
| 4,497,123 A | 2/1985 | Ehrlich |
| 4,510,702 A | 4/1985 | Ehrlich, Jr. |
| 4,513,449 A | 4/1985 | Donzis |

(56) References Cited

U.S. PATENT DOCUMENTS

| | | | |
|---|---|---|---|
| 4,518,643 A | 5/1985 | Francis |
| 4,523,393 A | 6/1985 | Inohara |
| 4,534,068 A | 8/1985 | Mitchell et al. |
| 4,535,553 A | 8/1985 | Derderian et al. |
| 4,538,301 A | 9/1985 | Sawatzki et al. |
| 4,538,366 A | 9/1985 | Norton |
| 4,546,555 A | 10/1985 | Spademan |
| 4,553,342 A | 11/1985 | Derderian et al. |
| 4,558,470 A | 12/1985 | Mitchell et al. |
| 4,562,651 A | 1/1986 | Frederick et al. |
| 4,566,137 A | 1/1986 | Gooding |
| 4,566,678 A | 1/1986 | Anderson |
| 4,578,296 A | 3/1986 | Miyazaki |
| 4,586,200 A | 5/1986 | Poon |
| 4,601,367 A | 7/1986 | Bongers |
| 4,614,000 A | 9/1986 | Mayer |
| 4,616,431 A | 10/1986 | Dassler |
| 4,619,055 A | 10/1986 | Davidson |
| 4,624,061 A | 11/1986 | Wezel et al. |
| 4,627,114 A * | 12/1986 | Mitchell ............................ 2/414 |
| 4,631,221 A | 12/1986 | Disselbeck et al. |
| 4,635,384 A | 1/1987 | Huh et al. |
| 4,635,981 A | 1/1987 | Friton |
| 4,642,814 A | 2/1987 | Godfrey |
| 4,657,716 A | 4/1987 | Schmidt |
| 4,666,130 A | 5/1987 | Denman |
| 4,667,423 A | 5/1987 | Autry et al. |
| 4,670,995 A | 6/1987 | Huang |
| 4,672,754 A | 6/1987 | Ehrlich |
| 4,676,010 A | 6/1987 | Cheskin |
| 4,680,875 A | 7/1987 | Danieli |
| 4,695,496 A | 9/1987 | Lee |
| 4,700,403 A | 10/1987 | Vacanti |
| 4,704,746 A | 11/1987 | Nava |
| 4,710,984 A | 12/1987 | Asper |
| 4,720,261 A | 1/1988 | Fishwick et al. |
| 4,722,131 A | 2/1988 | Huang |
| 4,724,549 A | 2/1988 | Herder et al. |
| 4,730,402 A | 3/1988 | Norton et al. |
| 4,739,762 A | 4/1988 | Palmaz |
| 4,741,114 A | 5/1988 | Stubblefield |
| 4,753,021 A | 6/1988 | Cohen |
| 4,759,136 A | 7/1988 | Stewart et al. |
| 4,763,426 A | 8/1988 | Polus et al. |
| 4,766,614 A | 8/1988 | Cantwell et al. |
| 4,768,295 A | 9/1988 | Ito |
| 4,798,009 A | 1/1989 | Colonel et al. |
| 4,808,469 A | 2/1989 | Hiles |
| 4,815,221 A | 3/1989 | Diaz |
| 4,817,304 A | 4/1989 | Parker et al. |
| 4,823,483 A | 4/1989 | Chapnick |
| 4,831,750 A | 5/1989 | Muller |
| 4,838,606 A | 6/1989 | Furubayashi et al. |
| 4,842,931 A | 6/1989 | Zook |
| 4,843,741 A | 7/1989 | Yung-Mao |
| 4,844,213 A | 7/1989 | Travis |
| 4,845,786 A | 7/1989 | Chiarella |
| 4,845,861 A | 7/1989 | Moumdjian |
| 4,845,863 A | 7/1989 | Yung-Mao |
| 4,852,704 A | 8/1989 | Brockenbrough |
| 4,856,208 A | 8/1989 | Zaccaro |
| 4,856,833 A | 8/1989 | Beekman |
| 4,858,343 A | 8/1989 | Flemming |
| 4,858,606 A | 8/1989 | Hamlin |
| 4,872,220 A | 10/1989 | Haruvy et al. |
| 4,876,053 A | 10/1989 | Norton |
| 4,883,299 A | 11/1989 | Bonar |
| 4,887,369 A | 12/1989 | Bailey |
| 4,890,877 A | 1/1990 | Ashtiani-Zarandi et al. |
| 4,899,467 A | 2/1990 | Mackey |
| 4,901,987 A | 2/1990 | Greenhill et al. |
| 4,904,008 A | 2/1990 | Glance |
| 4,905,382 A | 3/1990 | Yung-Mao |
| 4,909,661 A | 3/1990 | Ivey |
| 4,912,861 A | 4/1990 | Huang |
| 4,916,759 A | 4/1990 | Arai |
| 4,918,841 A | 4/1990 | Turner |
| 4,920,663 A | 5/1990 | Flemming |
| 4,922,630 A | 5/1990 | Robinson |
| 4,922,631 A | 5/1990 | Anderie |
| 4,923,650 A | 5/1990 | Antoon, Jr. et al. |
| 4,925,224 A | 5/1990 | Smiszek |
| 4,930,231 A | 6/1990 | Liu |
| 4,931,115 A | 6/1990 | Pajunen |
| 4,934,071 A | 6/1990 | Virgini |
| 4,941,701 A | 7/1990 | Loren |
| 4,951,986 A | 8/1990 | Hanfusa et al. |
| D310,893 S | 9/1990 | Broersma |
| 4,969,680 A | 11/1990 | Shimoda |
| 4,970,729 A | 11/1990 | Shimazaki |
| 4,972,611 A | 11/1990 | Swartz |
| 4,984,320 A | 1/1991 | Curley, Jr. et al. |
| 4,987,609 A | 1/1991 | Zahn |
| 4,993,173 A | 2/1991 | Gardener |
| 4,999,931 A | 3/1991 | Vermeulen |
| 5,011,642 A | 4/1991 | Welygan et al. |
| 5,014,449 A | 5/1991 | Richard et al. |
| 5,014,691 A | 5/1991 | Cueman et al. |
| 5,016,417 A | 5/1991 | Mentken |
| 5,025,504 A | 6/1991 | Benston et al. |
| 5,027,803 A | 7/1991 | Scholz et al. |
| 5,030,501 A | 7/1991 | Colvin et al. |
| 5,033,593 A | 7/1991 | Kazuhito |
| 5,035,009 A | 7/1991 | Wingo, Jr. et al. |
| 5,035,758 A | 7/1991 | Degler et al. |
| 5,042,174 A | 8/1991 | Nichols |
| 5,042,175 A | 8/1991 | Romen et al. |
| 5,042,859 A | 8/1991 | Zhang et al. |
| 5,044,096 A | 9/1991 | Polegato |
| 5,046,267 A | 9/1991 | Kilgore et al. |
| 5,048,203 A | 9/1991 | Kling |
| 5,056,162 A | 10/1991 | Tirums |
| 5,058,212 A | 10/1991 | Kamata |
| 5,066,400 A | 11/1991 | Rocklitz et al. |
| 5,068,922 A | 12/1991 | Zahn |
| 5,083,320 A | 1/1992 | Halstead |
| 5,083,361 A | 1/1992 | Rudy |
| 5,086,033 A | 2/1992 | Armor et al. |
| 5,092,060 A | 3/1992 | Frachey et al. |
| 5,093,938 A | 3/1992 | Kamata |
| 5,097,607 A | 3/1992 | Fredericksen |
| 5,098,124 A | 3/1992 | Breed et al. |
| 5,124,191 A | 6/1992 | Seksaria |
| 5,131,174 A | 7/1992 | Drew et al. |
| 5,150,935 A | 9/1992 | Glance et al. |
| 5,165,990 A | 11/1992 | Nakano |
| 5,168,576 A | 12/1992 | Krent et al. |
| 5,204,998 A | 4/1993 | Liu |
| 5,224,277 A | 7/1993 | Sang Do |
| 5,235,715 A | 8/1993 | Donzis |
| 5,244,745 A | 9/1993 | Seksaria et al. |
| 5,263,203 A | 11/1993 | Kraemer et al. |
| 5,271,103 A | 12/1993 | Darnell |
| 5,274,846 A | 1/1994 | Kolsky |
| 5,280,890 A | 1/1994 | Wydra |
| 5,282,288 A | 2/1994 | Henson |
| 5,324,460 A | 6/1994 | Briggs |
| 5,330,249 A | 7/1994 | Weber et al. |
| 5,376,318 A | 12/1994 | Ho |
| 5,409,200 A | 4/1995 | Zingher et al. |
| 5,421,035 A | 6/1995 | Klose et al. |
| 5,423,087 A | 6/1995 | Krent et al. |
| 5,439,733 A | 8/1995 | Paire |
| D364,487 S | 11/1995 | Tutton et al. |
| 5,477,558 A | 12/1995 | Volker et al. |
| 5,493,791 A | 2/1996 | Kramer |
| 5,543,194 A | 8/1996 | Rudy |
| 5,555,584 A | 9/1996 | Moore et al. |
| 5,572,804 A | 11/1996 | Skaja et al. |
| 5,581,818 A | 12/1996 | Lorenzi et al. |
| 5,588,165 A | 12/1996 | Fromme |
| 5,591,379 A | 1/1997 | Shores |
| 5,595,003 A | 1/1997 | Snow |
| 5,598,588 A | 2/1997 | Lee |

(56) References Cited

U.S. PATENT DOCUMENTS

| | | | |
|---|---|---|---|
| 5,611,153 A | 3/1997 | Fisher et al. | |
| 5,655,226 A | 8/1997 | Williams | |
| 5,669,079 A | 9/1997 | Morgan | |
| 5,734,994 A | 4/1998 | Rogers | |
| 5,741,568 A | 4/1998 | Rudy | |
| 5,766,704 A | 6/1998 | Allen et al. | |
| 5,891,372 A | 4/1999 | Besset et al. | |
| 5,913,412 A | 6/1999 | Huber et al. | |
| 5,946,734 A | 9/1999 | Vogan | |
| 5,950,244 A | 9/1999 | Fournier et al. | |
| D415,420 S | 10/1999 | Chen | |
| 5,976,451 A | 11/1999 | Skaja et al. | |
| 5,992,054 A | 11/1999 | Rauch | |
| 5,996,126 A | 12/1999 | Barthold et al. | |
| 6,029,962 A | 2/2000 | Shorten et al. | |
| 6,051,624 A | 4/2000 | Bastin et al. | |
| 6,070,271 A | 6/2000 | Williams | |
| 6,085,878 A | 7/2000 | Araki et al. | |
| 6,093,468 A | 7/2000 | Toms et al. | |
| 6,098,313 A | 8/2000 | Skaja | |
| 6,105,162 A | 8/2000 | Douglas et al. | |
| 6,105,176 A | 8/2000 | Egger | |
| 6,108,825 A | 8/2000 | Bell et al. | |
| 6,154,889 A | 12/2000 | Moore, III et al. | |
| 6,199,942 B1 | 3/2001 | Carroll et al. | |
| 6,219,850 B1 | 4/2001 | Halstead et al. | |
| 6,247,745 B1 | 6/2001 | Carroll et al. | |
| 6,298,497 B1 | 10/2001 | Chartrand | |
| 6,326,077 B1 | 12/2001 | Monaci | |
| 6,351,854 B1 | 3/2002 | Whalen et al. | |
| 6,353,953 B1 | 3/2002 | Tanaka et al. | |
| 6,381,759 B1 | 5/2002 | Katz | |
| 6,383,431 B1 | 5/2002 | Dobrin et al. | |
| 6,391,935 B1 | 5/2002 | Hager et al. | |
| 6,425,141 B1 | 7/2002 | Ewing et al. | |
| 6,434,755 B1 | 8/2002 | Halstead et al. | |
| 6,443,513 B1 | 9/2002 | Glance | |
| 6,446,270 B1 | 9/2002 | Durr | |
| 6,453,476 B1 | 9/2002 | Moore, III | |
| 6,457,261 B1 | 10/2002 | Crary | |
| 6,460,207 B1 | 10/2002 | Papay et al. | |
| 6,467,099 B2 | 10/2002 | Dennis et al. | |
| 6,485,446 B1 | 11/2002 | Brother et al. | |
| 6,499,147 B2 | 12/2002 | Schiebl et al. | |
| 6,532,602 B2 | 3/2003 | Watters et al. | |
| 6,533,258 B2 | 3/2003 | Monson et al. | |
| 6,536,052 B2 | 3/2003 | Tao et al. | |
| 6,550,850 B2 | 4/2003 | Laborie et al. | |
| D475,486 S | 6/2003 | Ide et al. | |
| 6,604,246 B1 | 8/2003 | Obreja | |
| 6,634,045 B1 | 10/2003 | DuDonis et al. | |
| 6,658,671 B1 | 12/2003 | Von Holst et al. | |
| 6,671,889 B2 | 1/2004 | Dennis et al. | |
| 6,679,544 B1 | 1/2004 | Hubbert et al. | |
| 6,679,967 B1 | 1/2004 | Carroll, III et al. | |
| 6,681,409 B2 | 1/2004 | Dennis et al. | |
| 6,682,128 B2 | 1/2004 | Carroll, III et al. | |
| D491,695 S | 6/2004 | Long | |
| 6,752,450 B2 | 6/2004 | Carroll, III et al. | |
| D492,818 S | 7/2004 | Ide et al. | |
| D495,096 S | 8/2004 | Long | |
| 6,803,005 B2 | 10/2004 | Dennis et al. | |
| 6,926,947 B1 | 8/2005 | Seckel | |
| 6,994,333 B2 | 2/2006 | Lobry et al. | |
| D521,191 S | 5/2006 | Berger | |
| D523,180 S | 6/2006 | Frye | |
| 7,078,443 B2 | 7/2006 | Milliren | |
| 7,240,376 B2 | 7/2006 | Ide et al. | |
| 7,255,910 B1 | 8/2007 | Seckel | |
| 7,299,505 B2 | 11/2007 | Dennis et al. | |
| 7,316,036 B2 | 1/2008 | Rudolf et al. | |
| 7,338,038 B2 | 3/2008 | Maurer et al. | |
| 7,341,776 B1 | 3/2008 | Milliren et al. | |
| 7,360,822 B2 | 4/2008 | Carroll, III et al. | |
| D570,055 S | 5/2008 | Ferrara et al. | |
| 7,377,577 B2 | 5/2008 | Carroll, III et al. | |
| 7,384,095 B2 | 6/2008 | Cormier | |
| 7,404,593 B2 | 7/2008 | Cormier | |
| D577,866 S | 9/2008 | Frye et al. | |
| D581,599 S | 11/2008 | Ferrara et al. | |
| D582,607 S | 12/2008 | Ferrara et al. | |
| 7,458,172 B2 * | 12/2008 | Aveni | 36/27 |
| 7,464,414 B2 | 12/2008 | McDuff | |
| D584,456 S | 1/2009 | Ferrara | |
| 7,513,344 B2 | 4/2009 | Toccalino | |
| 7,574,760 B2 | 8/2009 | Foley et al. | |
| D603,103 S | 10/2009 | Ferrara et al. | |
| 7,603,725 B2 | 10/2009 | Harris | |
| 7,625,023 B2 | 12/2009 | Audi et al. | |
| D608,688 S | 1/2010 | Dalzell et al. | |
| 7,673,351 B2 | 3/2010 | Copeland et al. | |
| 7,676,854 B2 | 3/2010 | Berger et al. | |
| 7,677,538 B2 | 3/2010 | Darnell et al. | |
| D617,503 S | 6/2010 | Szalkowski | |
| 7,730,635 B2 | 6/2010 | Aveni et al. | |
| D621,099 S | 8/2010 | Johnson et al. | |
| D622,449 S | 8/2010 | Culley et al. | |
| 7,774,866 B2 | 8/2010 | Ferrara | |
| 7,802,320 B2 | 9/2010 | Morgan | |
| 7,857,610 B2 | 12/2010 | Rossi et al. | |
| 7,866,248 B2 | 1/2011 | Moore et al. | |
| 7,895,681 B2 | 3/2011 | Ferrara | |
| D637,356 S | 5/2011 | Green et al. | |
| 7,950,073 B2 | 5/2011 | Ferrara | |
| D640,422 S | 6/2011 | Green et al. | |
| 7,959,023 B2 | 6/2011 | Ferrara | |
| 7,960,473 B2 | 6/2011 | Kobayashi et al. | |
| 8,039,078 B2 | 10/2011 | Moore et al. | |
| 8,047,602 B2 | 11/2011 | Sielhorst et al. | |
| 8,069,498 B2 | 12/2011 | Maddux et al. | |
| 8,087,187 B2 | 1/2012 | Aveni et al. | |
| 8,104,593 B2 | 1/2012 | Lin | |
| D655,051 S | 2/2012 | O'Keefe et al. | |
| 8,201,269 B2 | 6/2012 | Maddux et al. | |
| D663,076 S | 7/2012 | Parsons et al. | |
| D665,663 S | 8/2012 | Krupa | |
| D666,779 S | 9/2012 | Harris | |
| 8,348,031 B2 | 1/2013 | Smaldone et al. | |
| 8,387,164 B2 | 3/2013 | Maddux et al. | |
| 8,399,085 B2 | 3/2013 | Moore et al. | |
| 8,544,117 B2 | 10/2013 | Erb et al. | |
| 8,590,869 B2 | 11/2013 | Tavares et al. | |
| 2002/0017805 A1 | 2/2002 | Carroll, III et al. | |
| 2002/0120978 A1 | 9/2002 | Moore | |
| 2002/0152542 A1 | 10/2002 | Dennis et al. | |
| 2002/0163114 A1 | 11/2002 | Lobry et al. | |
| 2002/0168496 A1 | 11/2002 | Morimoto et al. | |
| 2003/0217483 A1 * | 11/2003 | Abraham | 36/28 |
| 2003/0230866 A1 | 12/2003 | Lee | |
| 2004/0128860 A1 | 7/2004 | Smaldone et al. | |
| 2004/0139531 A1 | 7/2004 | Moore et al. | |
| 2004/0154191 A1 | 8/2004 | Park | |
| 2004/0188898 A1 | 9/2004 | Siefermann et al. | |
| 2004/0199981 A1 | 10/2004 | Tucker | |
| 2004/0200094 A1 | 10/2004 | Baychar | |
| 2005/0050617 A1 | 3/2005 | Moore et al. | |
| 2005/0166302 A1 | 8/2005 | Dennis | |
| 2005/0196592 A1 | 9/2005 | Tao et al. | |
| 2005/0268383 A1 | 12/2005 | Harris | |
| 2006/0059605 A1 | 3/2006 | Ferrara | |
| 2006/0059606 A1 | 3/2006 | Ferrara | |
| 2006/0064900 A1 | 3/2006 | Aveni | |
| 2006/0070170 A1 * | 4/2006 | Copeland et al. | 2/411 |
| 2006/0101559 A1 | 5/2006 | Moore et al. | |
| 2006/0177635 A1 | 8/2006 | Pepe et al. | |
| 2007/0000032 A1 * | 1/2007 | Morgan | 2/412 |
| 2007/0083965 A1 | 4/2007 | Darnell et al. | |
| 2007/0190292 A1 * | 8/2007 | Ferrara | 428/166 |
| 2007/0190293 A1 | 8/2007 | Ferrara | |
| 2007/0281125 A1 | 12/2007 | Moore, III et al. | |
| 2008/0035442 A1 | 2/2008 | Spingler | |
| 2008/0036242 A1 | 2/2008 | Glance et al. | |
| 2008/0155735 A1 | 7/2008 | Ferrara | |
| 2008/0166524 A1 * | 7/2008 | Skaja et al. | 428/166 |

(56) References Cited

U.S. PATENT DOCUMENTS

| | | |
|---|---|---|
| 2008/0236378 A1 | 10/2008 | Sane et al. |
| 2008/0256686 A1 | 10/2008 | Ferrara |
| 2008/0307568 A1 | 12/2008 | Sajic |
| 2009/0038955 A1 | 2/2009 | Rau |
| 2009/0106882 A1 | 4/2009 | Nimmons et al. |
| 2009/0114083 A1 | 5/2009 | Moore et al. |
| 2009/0178184 A1 | 7/2009 | Brine, III et al. |
| 2009/0179361 A1 | 7/2009 | Vito et al. |
| 2009/0210998 A1 | 8/2009 | Rolla |
| 2009/0222975 A1 | 9/2009 | Green et al. |
| 2009/0265841 A1 | 10/2009 | Ferrara |
| 2009/0289026 A1 | 11/2009 | Ferrara |
| 2010/0000009 A1 | 1/2010 | Morgan |
| 2010/0037482 A1 | 2/2010 | Litchfield et al. |
| 2010/0186150 A1 | 7/2010 | Ferrara et al. |
| 2010/0258988 A1 | 10/2010 | Darnell et al. |
| 2010/0264571 A1 | 10/2010 | Tarazona De La Asuncion et al. |
| 2010/0273944 A1 | 10/2010 | Kobayashi et al. |
| 2010/0295221 A1 | 11/2010 | Kligerman et al. |
| 2010/0299812 A1 | 12/2010 | Maddux et al. |
| 2010/0299813 A1 | 12/2010 | Morgan |
| 2011/0047678 A1 | 3/2011 | Barth et al. |
| 2011/0047685 A1 | 3/2011 | Ferrara |
| 2011/0074075 A1 | 3/2011 | Henry et al. |
| 2011/0107503 A1 | 5/2011 | Morgan |
| 2011/0131695 A1 | 6/2011 | Maddux et al. |
| 2011/0167542 A1 | 7/2011 | Bayne et al. |
| 2011/0198788 A1 | 8/2011 | Hines |
| 2011/0296594 A1 | 12/2011 | Thomas et al. |
| 2012/0017358 A1 | 1/2012 | Princip et al. |
| 2012/0036620 A1 | 2/2012 | Harris |
| 2012/0060251 A1 | 3/2012 | Schimpf |
| 2012/0174293 A1 | 7/2012 | Milliren et al. |
| 2013/0152287 A1 | 6/2013 | Cormier et al. |

FOREIGN PATENT DOCUMENTS

| | | |
|---|---|---|
| CA | 2681439 | 11/2008 |
| CA | 2696242 | 2/2009 |
| CN | 10122784 | 7/2008 |
| CN | 101627222 | 1/2010 |
| CN | 101707885 | 5/2010 |
| CN | 10172099 | 6/2010 |
| CN | 101873811 | 10/2010 |
| EP | 1685019 | 8/2006 |
| EP | 1848293 | 10/2007 |
| EP | 1927294 | 6/2008 |
| EP | 1937466 | 7/2008 |
| EP | 1848293 | 7/2009 |
| EP | 2092210 | 8/2009 |
| EP | 2132516 | 12/2009 |
| EP | 2146177 | 1/2010 |
| EP | 2180802 | 5/2010 |
| ES | 2330138 | 12/2009 |
| FR | 2717659 | 9/1995 |
| HK | 1112163 | 11/2009 |
| JP | 54-148845 | 11/1979 |
| SU | 659134 | 4/1979 |
| WO | 91/05489 | 5/1991 |
| WO | 2006/005189 | 1/2006 |
| WO | 2006/088500 | 8/2006 |
| WO | 2006/089098 | 8/2006 |
| WO | 2006/089235 | 8/2006 |
| WO | 2007/035800 | 3/2007 |
| WO | 2008011708 | 1/2008 |
| WO | 2008/105840 | 9/2008 |
| WO | 2008/140650 | 11/2008 |
| WO | 2009/020583 | 2/2009 |
| WO | 2009/134334 | 11/2009 |
| WO | 2010/087957 | 8/2010 |

OTHER PUBLICATIONS

The Messier Project: the Technology, www.cascadeicehockey.com/the-technology.html, video slides of the Seven Technology, the video shows 80% compression (2 pages) Jan. 19, 2010.
Schutt Sports: Helmets—HotHead Technology, www.schuttsports.com/aspx/Sport/ProductCatalog.aspx?id=953 (1 page) Jan. 19, 2010.
Technology/SKYDEX, www.skydex.com/technology (3 pages) Jan. 19, 2010.
Blast Limiting/SKYDEX, www.skydex.com/technology/blast_limiting (7 pages) Jan. 19, 2010.
Impact Mitigation/SKYDEX, www.skydex.com/technology/impact_mitigation (7 pages) Jan. 19, 2010.
Manufacturing/SKYDEX, www.skydex.com/technology/manufacturing (2 pages) Jan. 19, 2010.
Development Process/SKYDEX, www.skydex.com/technology/development_process (2 pages) Jan. 19, 2010.
Selection Guide/SKYDEX, www.skydex.com/technology/selection_guide (3 pages) Jan. 19, 2010.
Patent Information/SKYDEX, www.skydex.com/technology/patent, (2 pages) Jan. 19, 2010.
Vs. Foam/SKYDEX, www.skydex.com/technology/vs_foam (1 page) Jan. 19, 2010.
Markets & Products/SKYDEX, www.skydex.com/markets_products, (3 pages) Jan. 19, 2010.
Military Ballistic Helmet Pads/SKYDEX, www.skydex.com/helmet_pads, (6 pages) Jan. 19, 2010.
Body Padding/SKYDEX, www.skydex.com/athletic/body_padding (1 page) Jan. 19, 2010.
International Search Report and Written Opinion from International Application No. PCT/US2011/038870 date of mailing Oct. 26, 2011.
International Search Report and Written Opinion for International Patent Application No. PCT/US11/38870 dated Oct. 26, 2011.
International Preliminary Report on Patentability for International Patent Application No. PCT/US11/38870 dated Dec. 4, 2012.
International Search Report and Written Opinion for International Patent Application No. PCT/US12/59474 dated Oct. 10, 2012.

* cited by examiner

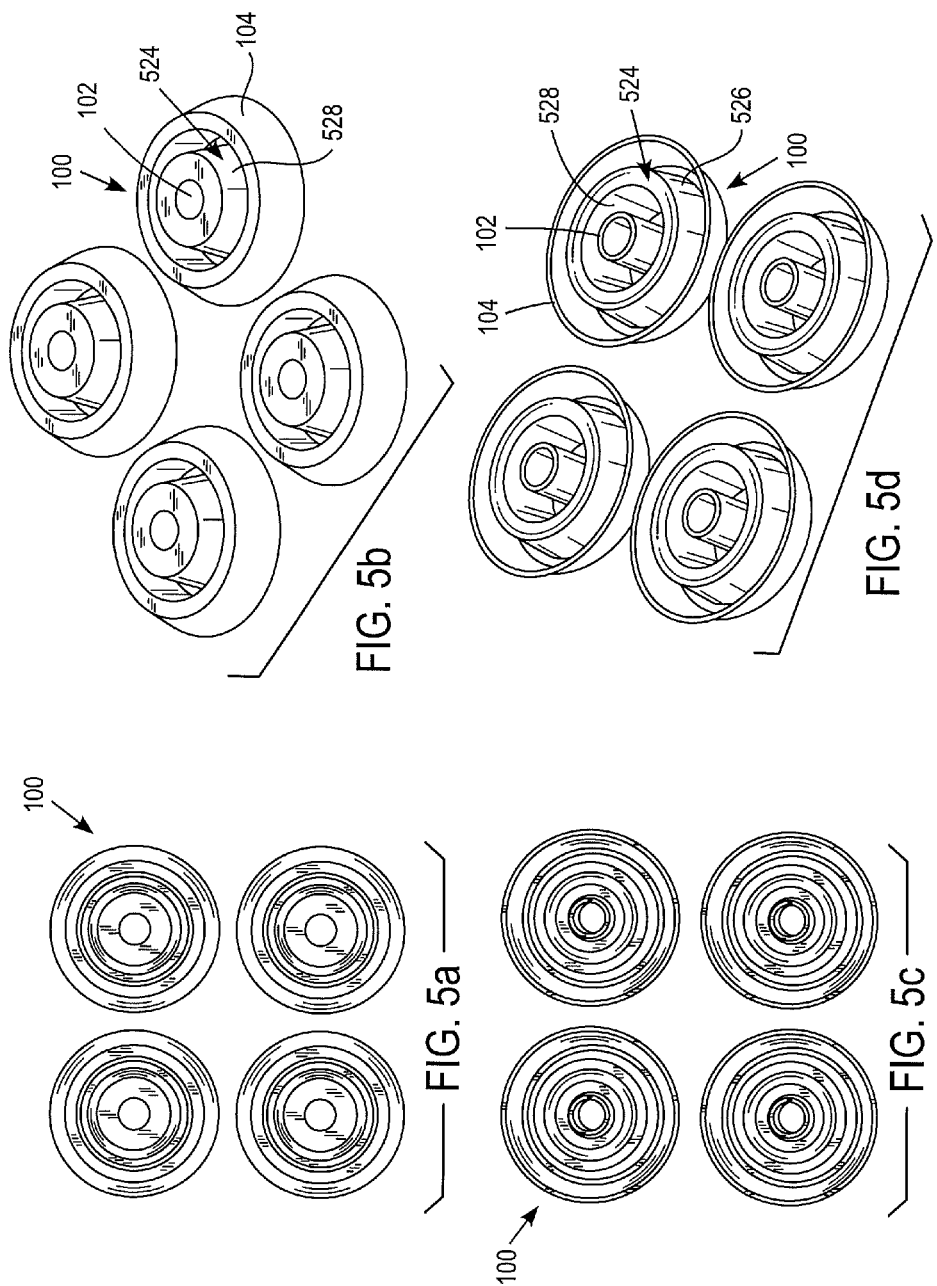

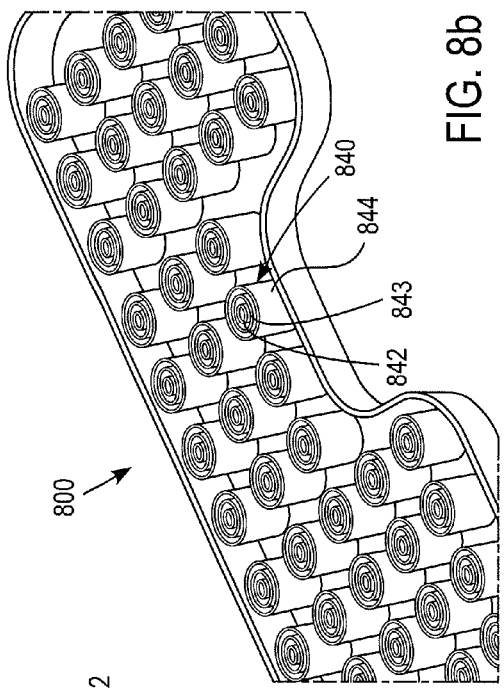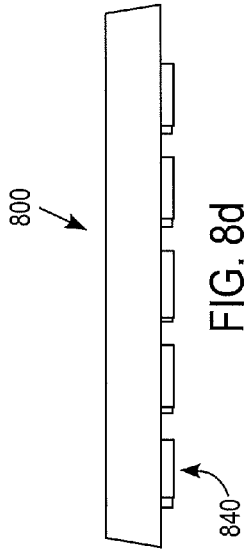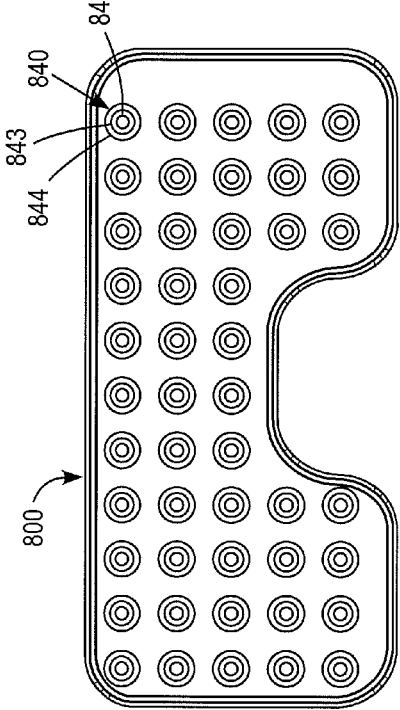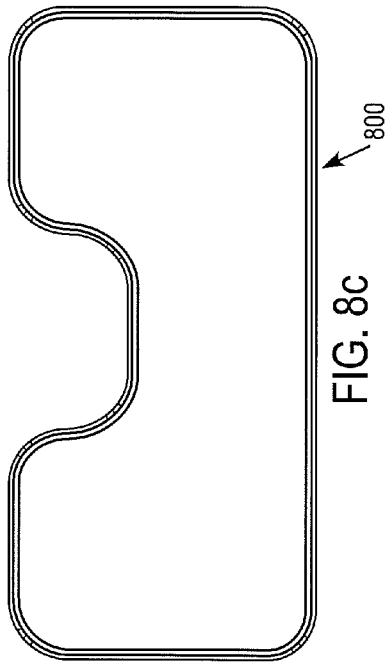

ENERGY MANAGEMENT STRUCTURE

BACKGROUND

This disclosure relates to an energy management structure, and particularly to an energy management structure that is adapted to absorb an impact force applied thereto. The energy management structure is applicable, but not limited, to body protective gear for military, athletic and recreational activities, for example, including a helmet where a chance of cranial impact is possible, protective pads (e.g., shoulder pads), and other pads such as cushions for hard seats and packing material.

Helmets and other types of protective gear used in military, athletic and recreational activities are intended to provide protection against a sudden impact. Generally, a helmet protects the head by preventing direct impact on the head, but also by causing the head to more gradually accelerate to a stop. The shell of the helmet and liner components together act as a system. The shell is constructed to provide rigidity to the helmet to guard against protruding objects, and is as a platform to support the liner structure. The liner is designed to complement the shell's geometry and regional stiffness, so that the liner and shell together provide a more ideal reduction in peak accelerations that would be observed should a head come to violent and sudden stop or accelerated state. In an impact scenario, the shell and liner provide an appropriate efficiency and stiffness response such that the head is more gently accelerated using as much of the available liner thickness as possible. Herein, "acceleration" is used to describe both acceleration and deceleration.

Expanded Polystyrene (EPS), Expanded Polypropylene (EPP), Ethyl Vinyl Acetate (EVA), Vinyl Nitrile (VN), and Polyurethane foams (PU) are conventional materials used for acceleration management inside helmets to protect the head. Non-foam materials, such as honeycomb, hemisphere and cylindrical crushable structures have been suggested as an alternative for managing impact forces applied to the helmet. All of these materials and structures exhibit crushing efficiencies, typically less than 75% compression until the material is considered bottomed. Crushing efficiency of the materials and structures are affected by their density. Generally, greater density results in increased stiffness. As stiffness is increased, crush efficiency is diminished. Crushable structures also have inherent crushing efficiencies, which are ultimately governed by the stacking-up of the structure walls at full compression. Structures such as honeycombs can be very stiff, but typically not very efficient or resilient. In order to reach full compression, wall damage of these structures is often observed.

SUMMARY

The deformation characteristics of the non-foam honeycomb, hemisphere and cylinder crushable structures display erratic buckling modes when subject to an impact force, which are discussed in further detail below. Such awkward or "noisy" deformation characteristics can degrade the crushable structures and result in highly reduced "multi-hit" capacity, for example. It is desirable to produce an improved crushable structure that in certain embodiments can offer increased impact performance compared to the conventional foams and structures.

The disclosure below discusses configurations that overcome the disadvantages of the conventional materials and structures by providing an energy management structure demonstrating a smoother deformation characteristic in response to an applied impact force. The energy management structures disclosed herein can have increased densifying efficiency (i.e., usable thickness before bottoming/densifying) and increased resiliency for multi-impact performance. The energy management structure is applicable, but not limited, to body protective gear including, for example, helmets and protective pads for military, athletic and recreational activities where a chance of cranial or other body part impact is possible. The energy management structures described herein are also applicable to a vest, arm/elbow pads, leg/knee pads and footwear, padding for hard seats and padding for shipping materials, for example.

According to one aspect, an energy management structure is adapted to absorb a force applied thereto. The structure comprises a first component possessing a first compressive response profile, a second component possessing a second compressive response profile different from the first compressive response profile, and a third component connecting the first component to the second component. Upon application of a force, the second compressive response profile of the second component is additive to the first compressive response profile of the first component to result in an overall compressive response profile of the energy management structure that meets a design compressive response profile.

According to some embodiments, at least one of the first compressive response profile and the second compressive response profile is erratic, and the design compressive response profile is smooth.

According to some embodiments, the design compressive response profile is defined by a smooth curve on a graph showing a stress/strain relationship of the structure in response to an applied force.

According to some embodiments, smoothness of the curve is based on the first component of the structure buckling and then bending when the force is applied to the structure, and the second component, surrounding the first component, beginning to bend or buckle when the first component transitions from bending to buckling.

According to some embodiments, the first compressive response profile possesses a compression profile characteristic that shows a transition point in compression resistance from a relatively high compression resistance to a relatively low compression resistance of the first component when a force is applied to the energy management structure, and the second compressive response profile possesses a compression profile characteristic that is additive to the compression profile characteristic of the first component at the transition point when the force is applied to the second component.

According to some embodiments, the first compressive response profile possesses a buckling/bending profile characteristic such that the first component buckles and then bends when the force is applied to the energy management structure, and the second compressive response profile possesses a bending/buckling profile characteristic such that the second component begins to bend or buckle when the first component transitions form buckling to bending.

According to some embodiments, the second component surrounds the first component.

According to some embodiments, the first component surrounds the second component.

According to some embodiments, wherein a recess is present between the first component and the second component and is formed by the first, second and third components.

According to some embodiments, the third component is provided at one of an upper or lower end of the structure.

According to some embodiments, the third component is provided at a location of the structure between an upper and lower end of the structure.

According to some embodiments, the first component is a center column extending from one end of the structure to an opposing end of the structure.

According to some embodiments, the first component includes at least one reinforcing rib on a side of the first component facing the second component.

According to some embodiments, the first component is corrugated, so that the first component has a wavy cross-sectional profile.

According to some embodiments, the second component includes at least one reinforcing rib.

According to some embodiments, the third component includes at least one aperture.

According to some embodiments, the second component surrounds the first component and the first component is hollow, and the aperture opens into the hollow first component.

According to some embodiments, one end of the first component extends to one end of the structure, and one end of the second component extends toward the one end of the structure and is offset from the one end of the first component, such that the second component does not extend as far as the one end of the first component.

According to some embodiments, the size of the offset of the one end of the second component relative to the one end of the first component is about 10% of the total height of the structure.

According to some embodiments, the structure has a frusta-conical shape.

According to some embodiments, the structure has a cylindrical shape.

According to some embodiments, the structure has a mushroom shape.

According to some embodiments, the structure is formed of a polymer material.

According to some embodiments, the structure is formed of thermoplastic elastomer.

According to some embodiments, the structure is formed of an injection-molded material.

According to some embodiments, the structure is configured to elastically deform in an axial direction of the structure when a force is applied to the structure.

According to some embodiments, the structure is configured to plastically deform in an axial direction of the structure when a force is applied to the structure.

According to some embodiments, the structure is crushable to about 30% of its original size.

According to some embodiments, the structure is crushable to about 20% of its original size.

According to some embodiments, the structure is crushable to about 10% of its original size.

According to some embodiments, the energy management structure further comprises a fourth component between the first and second components and connected to the third component, and the fourth component possesses a third compressive response profile.

According to some embodiments, the fourth component comprises two walls, one of the walls surrounding the other of the walls.

According to some embodiments, the second component is an outermost component and comprises walls that are separated from each other by gaps between the walls.

According to some embodiments, the gaps extend into the third component.

According to some embodiments, the energy management structure comprises a plurality of the first components surrounded by the second component, and each of the plurality of first components possesses a respective compressive response profile.

According to some embodiments, a height of the second component is the same as the height of each of the plurality of first components.

According to some embodiments, a height of the second component is the same as the height of some of the plurality of first components, such that the height of other of the of the plurality of first components is different than that of the second component.

According to some embodiments, each of the plurality of first components comprises a substructure having at least one wall surrounded by another wall.

According to some embodiments, at least one of the walls of the substructure is concentric to another wall of the substructure.

According to some embodiments, each of the plurality of substructures comprises a first subcomponent possessing a first compressive response profile, and a second subcomponent possessing a second compressive response profile different from the first compressive response profile. Upon application of a force, the second compressive response profile of the second subcomponent is additive to the first compressive response profile of the first subcomponent to result in an compressive response profile of the substructure that meets a design compressive response profile.

According to some embodiments, a height of the second component is the same as the height of each of the plurality of substructures.

According to some embodiments, a height of the second component is different than the height of the plurality of substructures.

According to another aspect, there is provided an array of energy management structures.

According to some embodiments, the structures in the array are connected to each other with a connector attached to a lower end portion of adjacent structures.

According to some embodiments, the structures in the array are identical.

According to some embodiments, the structures in the array are stackable on top of each other.

According to some embodiments, the array is enveloped in a padding.

According to another aspect, the energy management structure is adapted to be attached to the inside of a helmet.

According to some embodiments, the structure is detachably attachable to the helmet, so that the structure is detachable from one location on the helmet and reattachable to another location on the helmet.

According to a further aspect, there is provided a helmet including at least one energy management structure.

According to a further aspect, a method of designing an energy management system for body protective gear is provided. The energy management system comprises at least one energy management structure. The method comprises selectively distributing the at least one energy management structure to a desired location on the body protective gear.

According to another aspect, a method of designing an energy management structure adapted to absorb a force applied thereto, is provided. The method comprises determining a first compressive response profile of a first component, determining a second compressive response profile of a second component, the second compressive response profile being different from the first compressive response profile, and designing an energy management structure by coupling at least one first component having the first compressive response profile with at least one second component having the second compressive response profile to result in an overall compressive response profile of the energy management structure that meets a design compressive response profile. The determining steps are carried out in a specifically programmed computer executing code to carry out the steps.

According to some embodiments, at least one of the first compressive response profile and the second compressive response profile is erratic, and the design compressive response profile is smooth.

According to some embodiments, the design compressive response profile is defined by a smooth curve on a graph showing a stress/strain relationship of the structure in response to an applied force.

BRIEF DESCRIPTION OF THE DRAWINGS

FIG. 1b is another perspective view of the energy management structure according to the embodiment of FIG. 1a;

FIG. 1c is a plan view of the upper end of the energy management structure according to the embodiment of FIG. 1a;

FIG. 1d is a plan view of the opposite lower end of the energy management structure according to the embodiment of FIG. 1a;

FIG. 1e is a cross-sectional view of the energy management structure according to the embodiment of FIG. 1a;

FIG. 3b is another perspective view of the array of energy management structures according to the embodiment of FIG. 3a;

FIG. 3c is a perspective view showing compression of the array of energy management structures of FIG. 3a;

FIG. 3d is another perspective view showing compression of the array of energy management structures of FIG. 3a;

FIG. 3e is a perspective view showing the array of energy management structures enveloped in a foam of FIG. 3a;

FIG. 3f is another perspective view showing the array of energy management structures enveloped in a foam of FIG. 3a;

FIGS. 5a-5d illustrate different views of another embodiment of the energy management structure;

FIGS. 8a-8d illustrate different views of another embodiment of the energy management structure;

DETAILED DESCRIPTION OF EMBODIMENTS

Figure 1A:
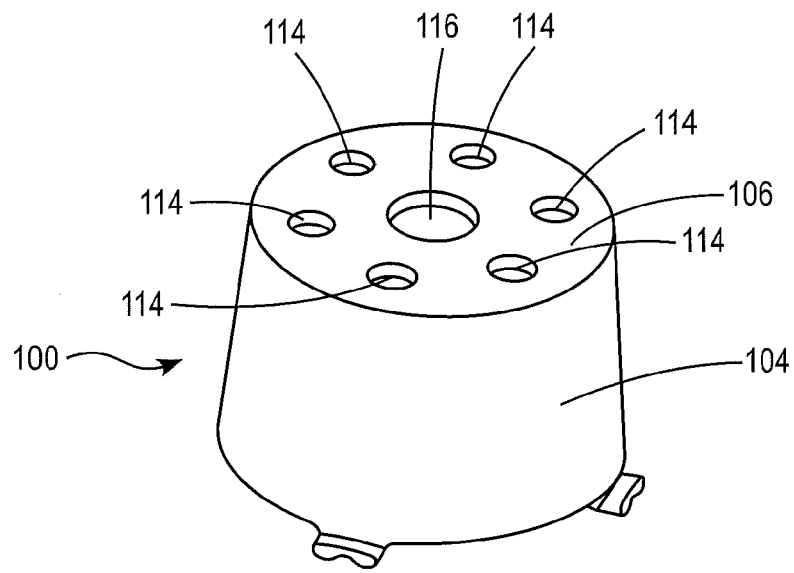
FIG. 1a is a perspective view of an energy management structure according to one embodiment.
Figure 1B:
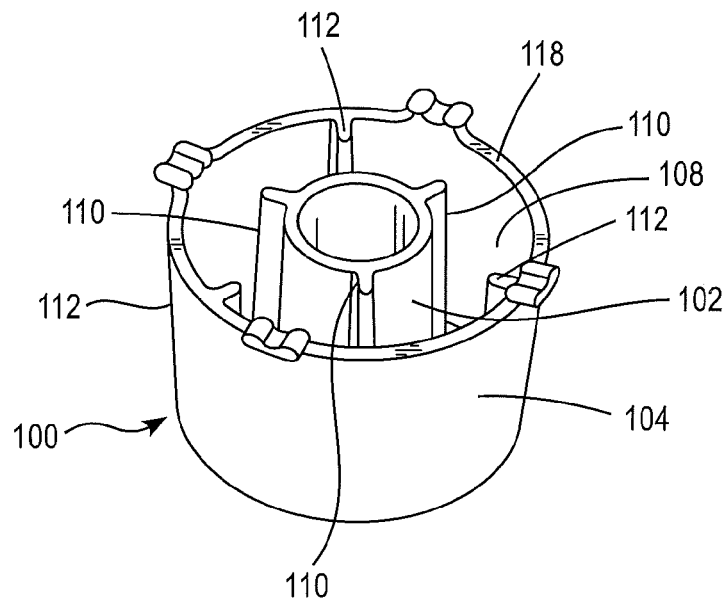
Figure 1C:
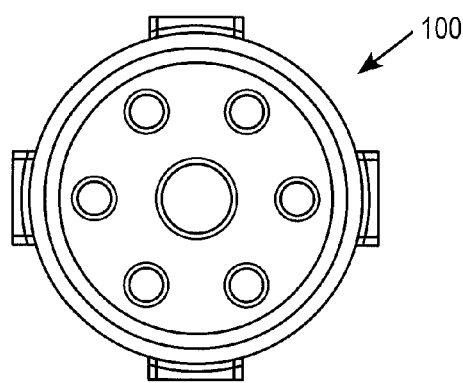
Figure 1D:
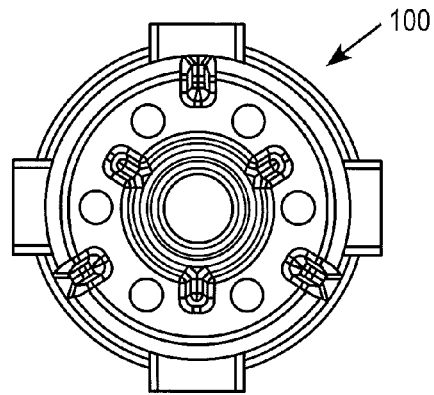
Figure 1E:
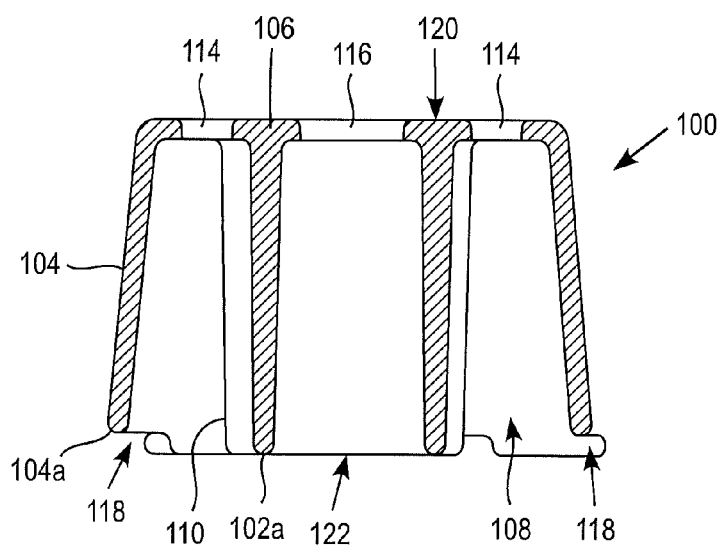

FIGS. 1a-1e illustrate an energy management structure 100 according to one embodiment. As shown in these figures, the energy management structure 100 includes a first component 102, a second component 104 and a third component 106. As shown in FIGS. 1b and 1e, the second component 104 surrounds the first component 102, so that a recess 108, formed by the first, second and third components is present between the first component 102 and the second component 104. While it is illustrated here that the "second component" 104 surrounds the "first component" 102, it will be recognized that the second component 104 may behave (as discussed below) like the first component 102, and vice versa, such that the "first component" may also refer to the component 104 surrounding the "second component" 102. The width of the recess is not particularly limited, and provides space for the first component 102 to buckle/bend before bending or buckling of the second component 104. In the illustrated embodiment, the second component 104 concentrically surrounds the first component 102. However, in some embodiments, the second component 104 and the first component 102 do not share the same axis. That is, the first component 102 may be disposed off-center relative to the second component 104. The shape of the first component 102 is not particularly limited, although some shapes have greater advantages than others. The shape may be comprised of a column in the form of a circular tube. Alternatively, the profile of the first component 102 may have a polygonal shape, such as a triangular, rectangular, pentagonal, hexagonal or other multi-sided shape. In the embodiment, the first component 102 is arranged to extend from the upper end 120 of the structure 100 to an opposing lower end 122 of the structure 100. In the embodiment, the first component 102 is hollow. However, a solid, un-hollow first component 102 gives additional stiffness to the first component 102. Further, the shape of the second component 104 is not particularly limited, and may be circular, triangular, rectangular, pentagonal, hexagonal or have another multi-sided shape.

A third component 106 connects the first component 102 to the second component 104, and is generally shaped to match the profile of the second component 104. For instance, if the second component 104 possesses a generally circular shape, the third component 106 also possesses a circular shape. However, the shape of the third component 106 may be different from the shape of the second component 104. The third component 106 can help to spread the point load of an impact force applied to the structure 100, but primarily is in place to assure the first and second components work in concert, for example, and provides a spatial relationship that the second component engages at a certain point in the crushing of the first component. The third component 106 may be provided at an upper end 120 or lower end 122 of the structure 100. Alternatively, the third component 106 may be provided at a location of the structure 100 between the upper end 120 and the lower end 122 of the structure 100, such as at the midpoint between the upper end 120 and the lower end 122. In the illustrated embodiment, the third component 106 is provided at the upper end 120 of the structure 100. The third component 106 in this embodiment is substantially planar and orthogonal to the center axis of the structure 100. However, the third component 106 may be convex, or may have an overall concave shape. It is preferable that the third component 106 be substantially planar and orthogonal to the center axis of the structure 100 to better distribute the load of the force applied to the structure 100 and/or avoid the creation of pressure points or spikes, and may also act to provide greater area for affixing (e.g., gluing) the energy management structure to another structure, such as the inside of padding or a helmet, for example.

In some embodiments, the third component 106 includes apertures 114. Apertures 114 open into the recess 108 between the first component 102 and the second component 104. In addition, in embodiments where the first component 102 is hollow as discussed above, the third component 106 may include an aperture 116 opening into the hollow first component 102. The apertures 114, 116 may assist with the evacuation of air within the recess 108 and hollow first component 102 when the structure 100 is rapidly compressed upon application of an impact force. The evacuation of air from within the structure 100 may contribute to enhanced compressibility of the structure 100 by providing a channeled escape route of rapidly compressed air, if the design parameters suggest the appropriateness of this feature. In some embodiments, the compression force of trapped air or other gasses might be desirable. Compressibility of the structure 100 is discussed in further detail below.

According to some embodiments, the first component 102 includes one or more reinforcing ribs 110 on a side of the first component 102 in the recess 108 facing the second component 104. The reinforcing ribs 110 provide added stiffness to the first component 102. In the illustrated embodiment, the first component 102 includes three ribs 110. However, the number of ribs 110 may be more or less. In a preferred embodiment, the reinforcing ribs 110 extend longitudinally from the upper end 120 of the structure 100 to the lower end 122 of the structure 100. In some embodiments, the reinforcing ribs 110 extend along the first component 102 for only a portion of the extension from the upper end 120 to the lower end 122 of the structure.

As an alternative to the longitudinally extending reinforcing ribs 110, the first component may have at least one spiral rib 110 extending spirally between the upper end 120 of the structure 100 and the lower end 122 of the structure 100. As a further alternative, the first component 102 may corrugated, so that the first component 102 has a wavy profile.

Further, the second component 104 may include reinforcing ribs 112 on a side of the second component 104 in the recess 108 facing the first component 102. Similar to the first component reinforcing ribs 110, the second component reinforcing ribs 112 may extend longitudinally from the upper end 120 of the structure 100 to the lower end 122 of the structure 100. In the illustrated embodiment, the second component 104 includes three ribs 112. However, the number of ribs 112 may be more or less. In other embodiments, the second component reinforcing ribs 112 extend along the second component 104 for only a portion of the extension from the upper end 120 to the lower end 122 of the structure 100. Alternatively, the second component 104 may have at least one spiral rib 112 extending spirally inside the structure 100 between the upper end 120 of the structure 100 and the lower end 122 of the structure. In some embodiments, the structure 100 includes the ribs 110 on the first component 102 and the ribs 112 on the second component 104. In these embodiments, the first component ribs 110 and the second component ribs 112 may be radially offset from each other as shown in FIG. 1b.

In all of the embodiments discussed above, one end 102a of the first component 102 may extend all the way to the lower end 122 of the structure 100, and one end 104a of the second component 104 may extend to a lesser extent toward the lower end 122 end of the structure 100 as shown in FIG. 1e. In this regard, the second component 104 does not extend as far toward the end 122 of the structure 100 as the first component 102. That is, as principally shown in FIG. 1e, an offset 118 is provided at the at the outer circumference of the structure 100 at the lower end 122. The size of the offset 118 of the end 104a of the second component 104 relative to the end 102a of the first component 102 may range from about 5% to 20% of the total height of the structure 100. The size of the offset 118 is about 10% of the total height of the structure 100 in this particular embodiment, but the offset may be determined by the additive compression profiles. The offset 118 adds significant stiffness to the overall structure 100 during compression after the first component 102 has buckled and can be dimensioned to substantively engage when the first component 102 is transitioning from buckling to bending modes, as explained below. The second component 104 substantively engages during an impact event when it measurably adds to the crush resistance. For instance, if the second component 104 had a thin skirt that extended as far as the first component 102 for aesthetics, sealing, or a second part of a third component (so that the third component 106 appears on each end of the first and second components 102 and 104 etc.), but the thin skirt did not add differentially to the crush resistance, it could be part of the offset 118.

Figure 2A:
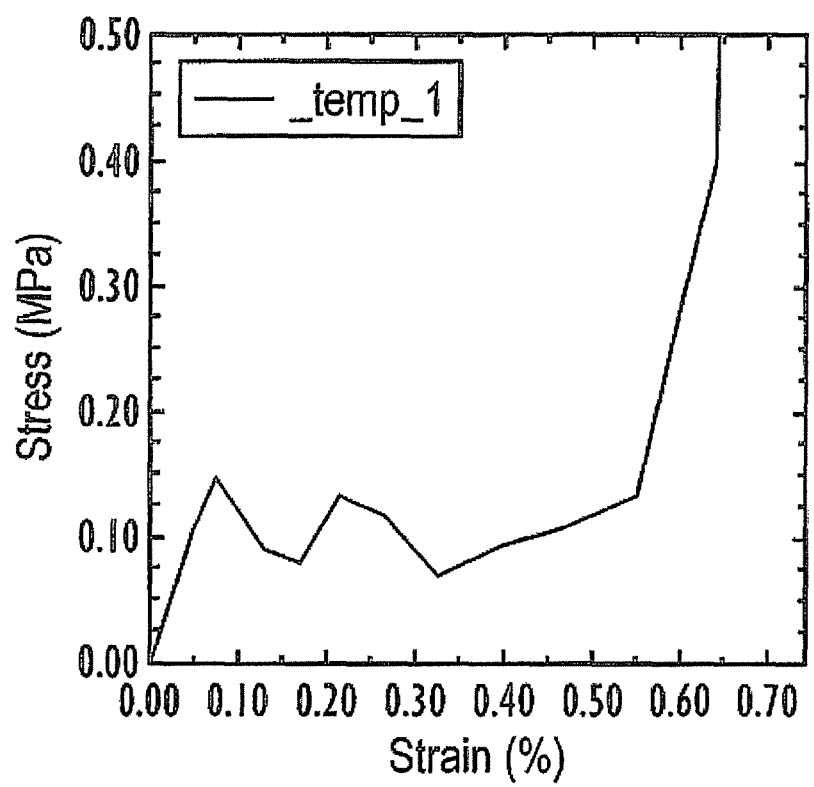
FIG. 2a is a stress/strain curve graphically illustrating the results of a Finite Element Analysis performed on a conventional structure.

Conventional structures often possess a deformation characteristic that is erratic when subject to an impact force. This is evidenced by the graph shown in FIG. 2a illustrating the results of a Finite Element Analysis performed on a conventional structure. The graph in FIG. 2a shows the compression response characteristic in terms of stress versus strain of the conventional structure due to an applied constant velocity compression force. The compression response characteristic here is defined by a line which increases and decreases rapidly with sharp peaks and valleys. Such an awkward or "noisy" deformation characteristic degrades the structure's performance and results in a highly reduced ability of the conventional structure to sustain repeatable and predictable impact performance. That is, the "noisy" deformation characteristic yields a less predictable and poor repeatable impact performance.

According to the embodiments discussed above, the first component 102 provides an initial stiffness, especially when anchored to the third component 106 at the upper end 120 of the structure 100. When the first component 102 initially yields to an applied impact force, the first component 102 begins to buckle. Eventually, the first component 102 bends as the applied impact force increases. The second component 104 does not initially bend or buckle when the first component 102 begins to buckle. This is, in part, due to the offset 118, in the illustrated embodiment. That is, when the impact force is first applied to the structure 100, only the first component 102 is affected initially, by buckling. The second component 104 begins bend or buckle under the applied impact force when the first component 102 transitions from buckling to bending. The second component 104 does not have to engage exactly when the transition of buckling to bending of the first component 102, but within a range that the second component 104 has a measurable effect on smoothing the crush profile of the first component 102.

As discussed above, the offset 118 may affect the timing of the bending/buckling of the second component 104 relative to the first component 102. It is also possible, however, to manipulate the timing of the bending/buckling of the second component 104 relative to the first component 102 by (i) increasing/decreasing the wall thickness of the second component 104 relative to the wall thickness of the first component 102 and vice versa, (ii) enlarging/reducing the recess 108 between the first component 102 and the second component 104 so that the first component 102 is farther/closer to the second component 104, and/or (iii) eliminating the offset 118, or changing the height of the offset 118 (including changing the height of one offset 118 relative to the height of another offset 118).

Figure 2B:
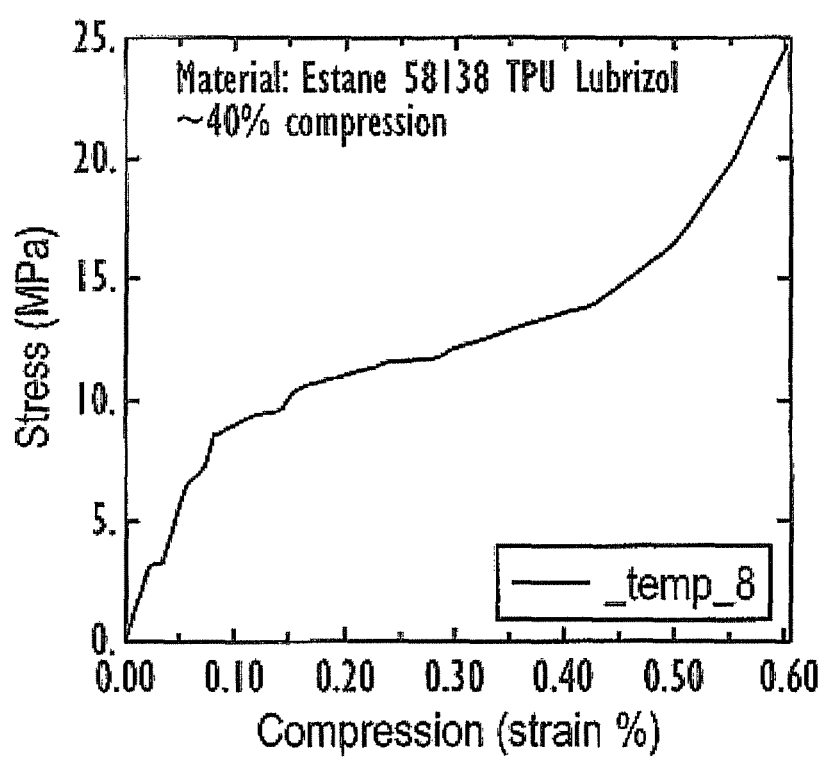
FIG. 2b is a stress/strain curve graphically illustrating the results of a Finite Element Analysis performed on an energy management structure disclosed herein.

According to the above configurations, the first component 102 possesses a compressive response profile having a buckling/bending profile characteristic such that the first component 102 buckles and then bends when an impact force is applied to the structure 100. The second component 104 possesses compressive response profile different from that of the first component 102 and having a bending/buckling profile characteristic such that the second component begins to bend or buckle when the first component transitions from buckling to bending. As a result, the energy management structure 100 as a whole demonstrates a more uniform deformation characteristic in response to an applied impact force than the conventional structure. This is evidenced by comparing the graph in FIG. 2b illustrating the results of a Finite Element Analysis performed on the energy management structure 100 according to the embodiments discussed herein, with the graph in FIG. 2a illustrating the results of the analysis performed on the conventional structure. The graph in FIG. 2b shows the compression response characteristic in terms of stress versus strain of the structure 100 due to a compression force applied thereto. As shown in FIG. 2b, the compression response characteristic is defined by a smooth curve that increases relatively rapidly at first before tapering, and then increases again. The definition of "smooth" as used herein means that the curve extends without steep and/or pointed peeks and valleys, or sudden/abrupt changes in direction. The smoothness of the curve in FIG. 2b is based on the first component 102 of the structure 100 first buckling and then bending when the impact force is applied to the structure 100, and the second component 104, due at least in part to the offset 118, beginning to bend or buckle when the first component 102 transitions from buckling to bending.

Figure 2C:
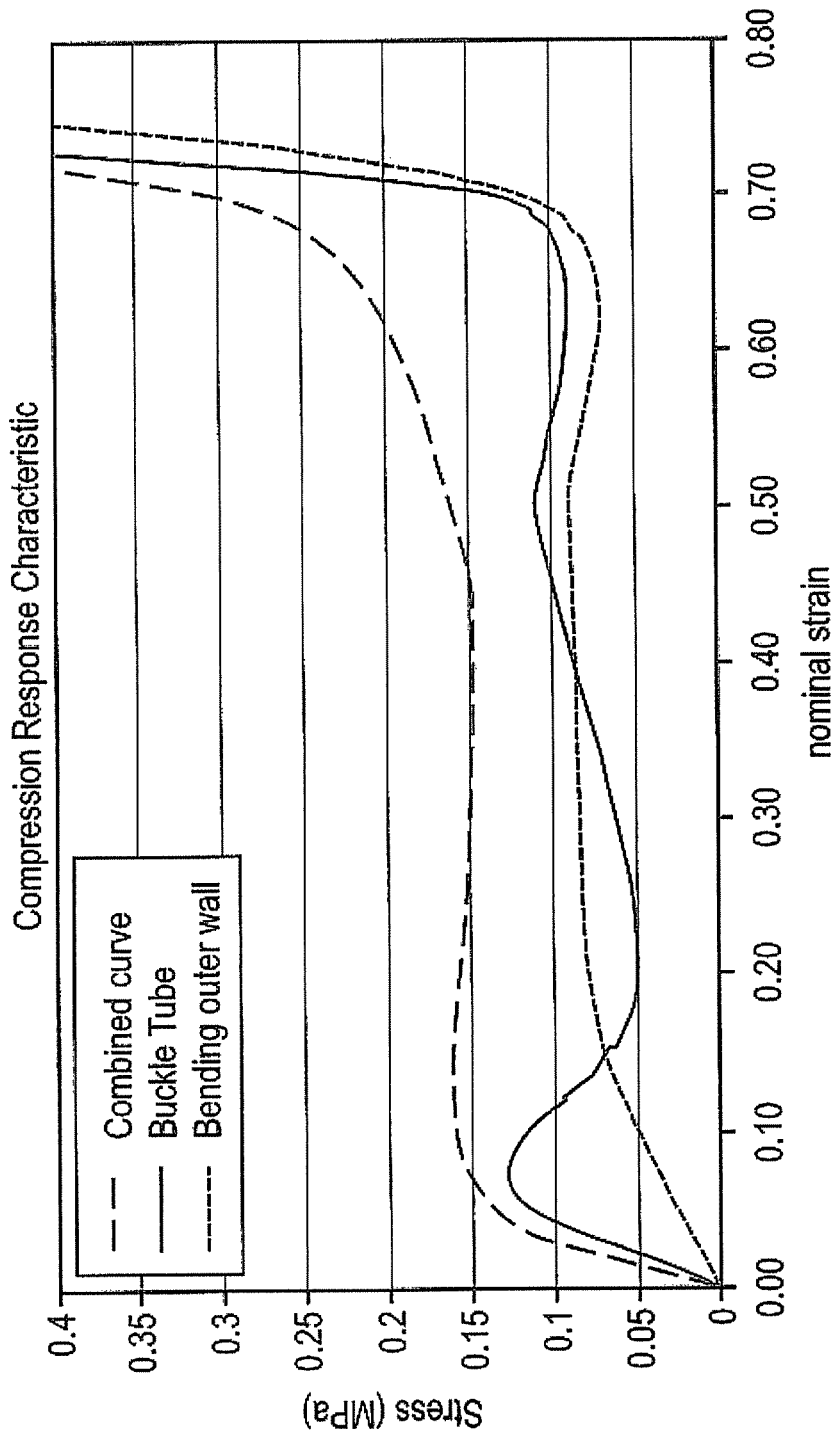
FIG. 2c illustrates a compression characteristics of an energy management structure disclosed herein.

Accordingly, upon application of a force, the second compressive response profile of the second component 104 is additive to the first compressive response profile of the first component 102 to result in an overall compressive response profile of the energy management structure 100 that meets a desired design compressive response profile. That is, the first compressive response profile possesses a compression profile characteristic that shows a transition point in compression resistance from a relatively high compression resistance to a relatively low compression resistance of the first component 102 when a force is applied to the energy management structure, and the second compressive response profile possesses a compression profile characteristic that is additive to the compression profile characteristic of the first component 102 at the transition point when the force is applied to the second component 104. Thus, even if one or both of the first compressive response profile and the second compressive response profile is erratic (by design or otherwise), when added together the first and second compressive response profiles result in an overall design compressive response profile is smooth. This principle is illustrated by the stress/strain graph in FIG. 2c, which shows the compression response characteristic of the energy management structure by adding together the compressive response profiles of the first and second components 102, 104, respectively. As shown in FIG. 2c, the compressive response profile of the first component 102 is somewhat erratic, while the and the compressive response profile of the second component 104 is smoother.

The combined curve in the graph (representing the overall compressive response profile of the energy management structure 100) shown with the broken line represents the sum of the first and second compressive response profiles and is a smooth curve that increases relatively rapidly at first before tapering, and then increases. As discussed above, the smoothness of the curve is based on the first component 102 of the structure 100 buckling and then bending when the force is applied to the structure 100, and the second component 104 beginning to bend or buckle when the first component 102 transitions from bending to buckling.

The smoothness of the curve in FIGS. 2b and 2c may also result, without an offset 118, by adjusting the angle of the second component 104 relative to the first component 102, increasing/decreasing the wall thickness of the second component 104 relative to the wall thickness of the first component 102, and/or enlarging/reducing the recess 108 between the first component 102 and the second component 104 so that the first component 102 is farther/closer to the second component 104. The smooth curve compressive response profile results in the structure 100 providing a more ideal impact response as compared to the conventional structures.

In addition, the usable thickness of the structure 100, before bottoming/densifying in response to an impact force (i.e., densifying efficiency), is increased. Further, the structure 100 exhibits a relatively high stiffness per unit density. As used herein, stiffness generally describes a stress/strain measurement obtained by compressing the structure 100 to around the plateau magnitude, which occurs at about 10%-20% compression of the structure 100. It is noted that in the above embodiments, each of the first component 102 and the second component 104 both bend and buckle. However, in other embodiments, the first component 102 and/or the second component 104 simply buckle. In alternative embodiments, the first component 102 and/or the second component 104 simply bend.

In some embodiments, the structure 100 is crushable to about 30% of its original size when an impact or compression force is applied to the structure 100. In other embodiments, the structure 100 is crushable to about 20% of its original size when an impact force is applied. Preferably, for a military helmet of a particular design, the illustrated structure 100 is crushable to about 10% of its original size. Stiffness, cost, and weight requirements may govern (i.e., increase/reduce the crushability (e.g., less than the 10-30% range) of the structure 100. The structure 100 according to the above embodiments is formed of a material which permits the structure 100 to elastically deform in an axial direction of the structure 100 when an impact force is applied to the structure 100, thus allowing the structure to sustain multiple successive impact forces if particular material used is not stretched passed it's plastic yield point. In this regard, the structure 100 may be formed of a polymer material, a thermoplastic elastomer or an injection-molded material. Additional processes used to form the structure include compression molding, rim molding and casting.

In other embodiments, the structure 100 may be configured to plastically deform in an axial direction of the structure 100 upon an application of an impact force. In addition, the structure 100 exhibits a tangential compression when a force is applied tangentially to the structure 100 rather than axially. The tangential compression of the structure is greater than the axial compression of the structure 100. That is, the structure 100 compresses tangentially easier than the structure 100 compresses axially in this embodiment. The tangential compression of the structure 100 enables the structure 100 to absorb a force that grazes the structure 100 in a direction tangential to the structure 100. This ability to absorb glancing blows, for instance, can result in reduced trauma to the wearer. For instance, by controlling the tangential component of a compression profile, an outer part of the helmet, for instance, might be permitted to rapidly rotate relative to the head of the wearer so that the wearer's head does not have to, thus reducing the chances of trauma to the brain or neck of the wearer. In other words, the energy management structure absorbs the tangential energy so that the wearer's head and neck do not have to. Of course, this is not limited to helmets, and extends to other body protective gear.

The structure 100 may be formed of a stiff thermoplastic elastomer (TPE) or plastic urethane. Other materials include Expanded Polystyrene (EPS) and Expanded Polypropylene (EPP). A softer material with much higher strain until plastic yield, such as Estane 58138 and Thermoplastic Urethane (TPU) may also be used. TPU, which may reach about 500% strain before breaking, possesses a flexural modulus of 0.731 MPa, an elongation prior to break of greater than 400%, and a plastic yield of about 4% material strain. However, a structure formed of this material may have regions that will plastically deform at about 20% compression.

According to the embodiments discussed herein, the structure 100 is rotationally symmetric. In alternative embodiments, however, the structure 100 may not be rotationally symmetric. In some embodiments, the structure 100 has a frusta-conical shape as shown in FIGS. 1a-1c. That is, the lower end 122 open end of the structure 100 has a larger circumference than the upper end 120 of the structure 100. Alternatively, the structure 100 may be cylindrically shaped. As a further alternative, the structure 100 may have a mushroom shape in profile. In exemplary embodiments of a design usable for military helmets, the height of the structure 100 is about 0.5 inches, and the outer diameter of the structure 100 at the lower end 122 is about 0.75 inches. However, the structure is not limited to these dimensions. The dimensions may be scaled up or down depending on the application in which the structure 100 is used. Further, thickness of the walls of the first component 102, the second component 104 and the third component 106 may be varied depending on the application in which the structure 100 used. The thickness of the walls of the components may be varied or tapered depending on the applications in which the structure 100 is used and tooling requirements for manufacturing the structure 100.

Figure 3A:
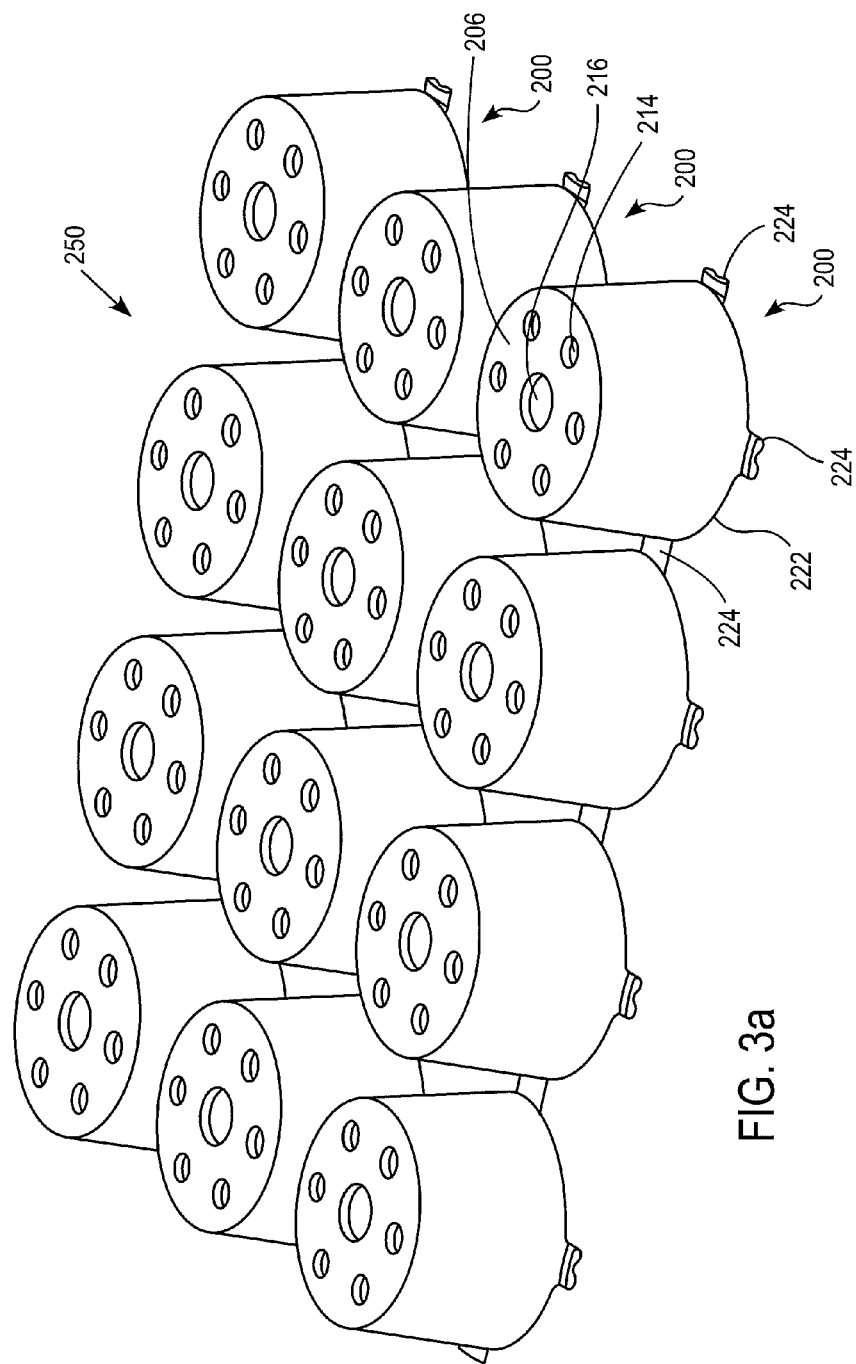
FIG. 3a is a perspective view of an array of energy management structures according to one embodiment.
Figure 3B:
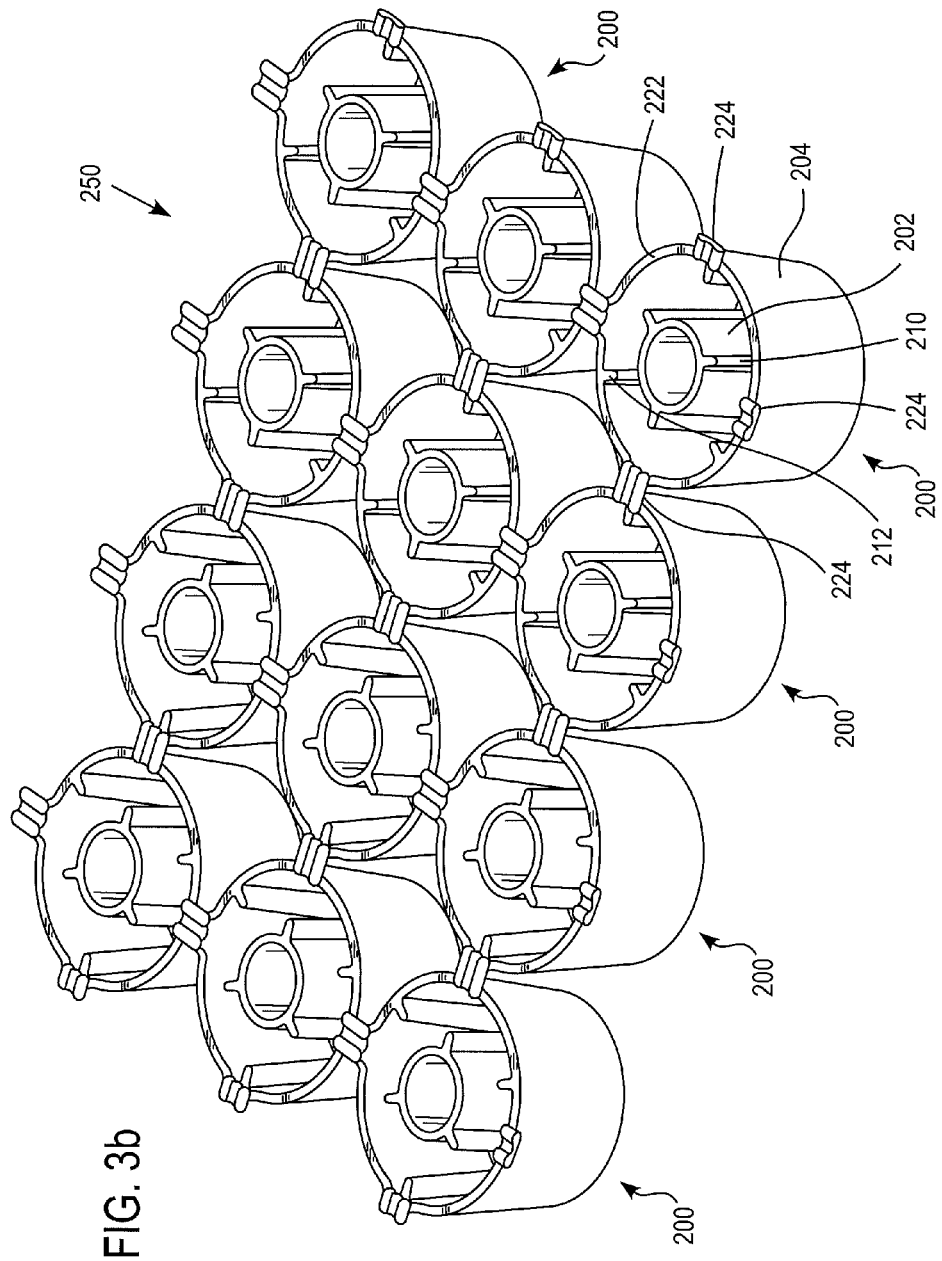

FIGS. 3a and 3b show one embodiment of an array 250 of energy management structures 200 adapted to absorb a force applied thereto. Each structure 200 of the array 250 includes a first component 202 possessing a compressive response profile having a buckling/bending profile characteristic such that the first component 202 buckles and then bends when the force is applied to the energy management structure 200, and a second component 204 surrounding the first component 202 (or vice versa) and possessing a compressive response profile having a bending/buckling profile characteristic such that the second component 204 begins to bend or buckle when the first component 202 transitions from buckling to bending. A third component 206 connects the first component 202 to the second component 204. Each structure 200 in the array 250 may be configured according to any of the embodiments discussed above with respect to the energy management structure 100. The structures 200 in the array 250 are connected to each other with a connector 224 attached to a lower end portion 222 of adjacent structures 200. In some embodiments, the connector 224 may be attached to an upper end portion 220 of adjacent structures 200 or to a location between the upper end portion 220 and the lower end portion 222. In the exemplary embodiment, the connector 224 is about 0.2 inches wide. However, the size of the connector 224 may be more or less depending on the application in which the array 250 is used.

Figure 3C:
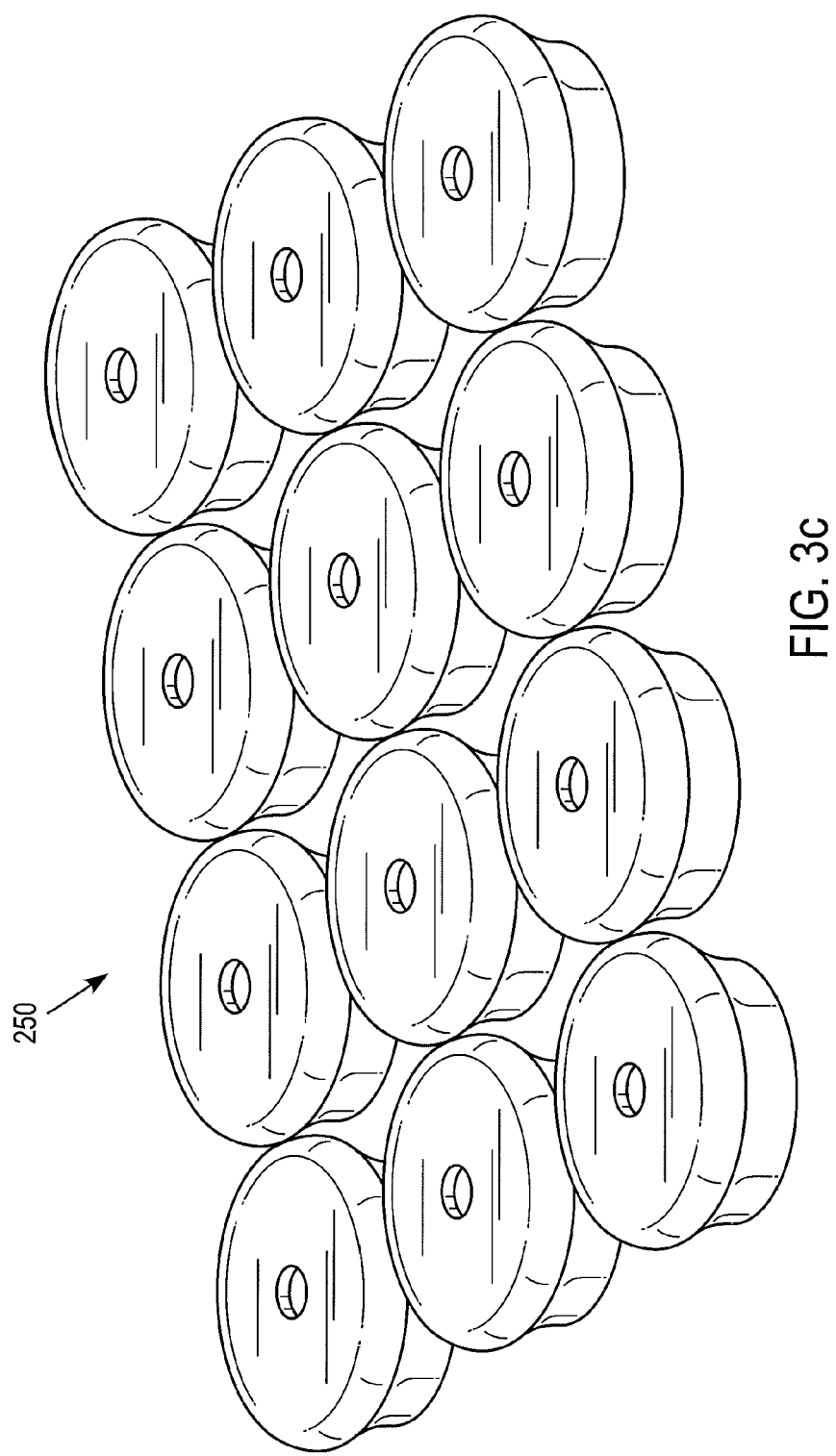
Figure 3D:
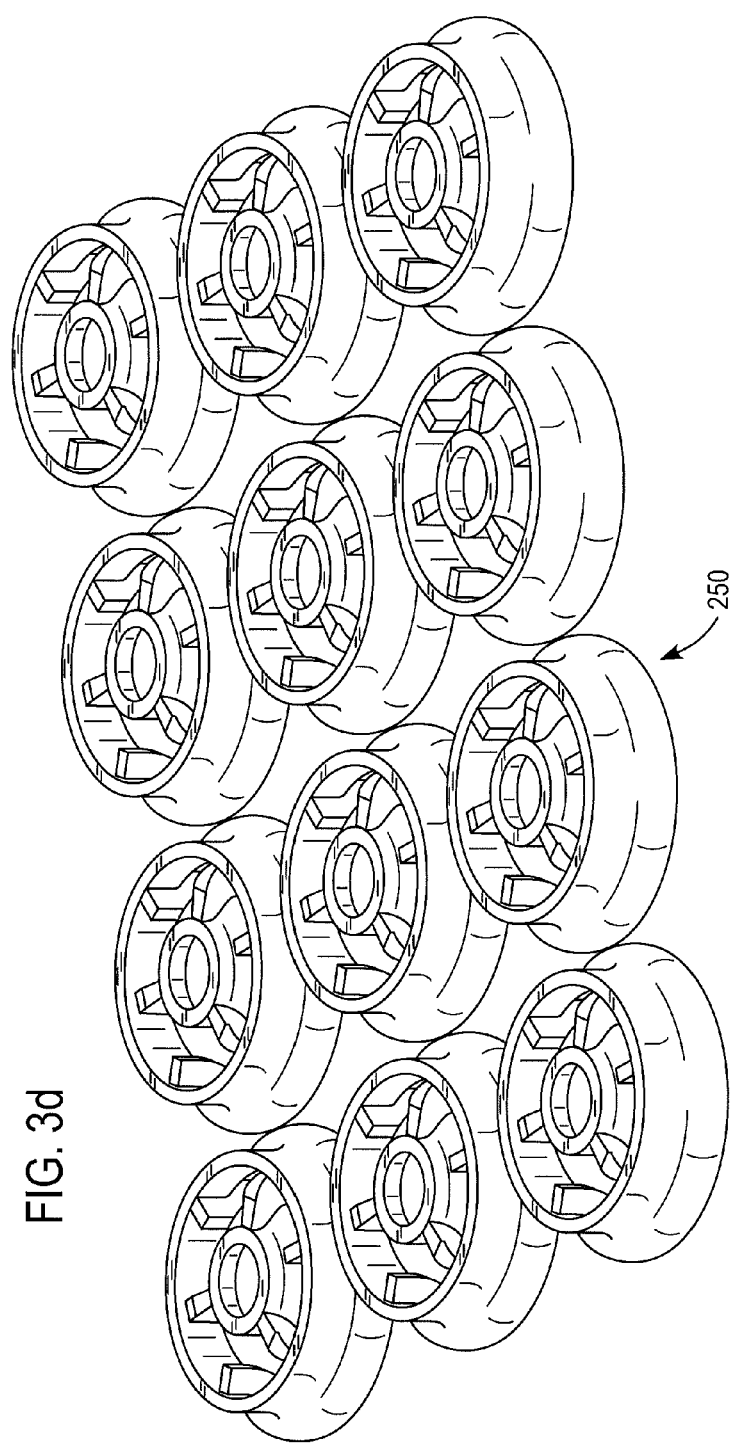

As shown in FIGS. 3a and 3b, the array 250 is rectangular in plan view. However, the array 250 may be formed in any shape suitable for the particular application in which the array is used. For example, the array 250 may be circular, triangular, pentagonal, hexagonal, star shaped, or any other desired polygonal shape. In this regard, the total number of structures 200 in the array 250 is not particularly limited, and may include any desired number of structures 200. FIGS. 3c and 3d show compression of the array 250 of energy management structures 200 in response to an impact force applied to the entire array 250. In some instances, only one or some of the structures 200 in the array may compress in response to the impact force.

In the illustrated embodiment, the structures 200 in the array 250 are identical. In other embodiments, some of the structures 200 in the array 250 may be different from the other structures 200 in the array 250. For instance, some of the structures 200 in the array 250 may be formed according to one or more embodiments of the structure 100 discussed above, while other of the structures 200 in the array 250 may be formed according to other embodiments of the structure 100 discussed above. In different embodiments, some of the structures 200 in the array 250 may inverted, such that the upper end 220 of some structures 200 are adjacent the lower end 222 of adjacent structures 200.

In addition, additional structures 200 may be stackable on top of the structures 200 in the array 250. For example, the upper end 220 of the additional structures 200 may be in contact with the upper end of the structures 200 in the array 250. The number of layers of additional structures 200 on top of the array 250 is not particularly limited, may include any desired number of layers of additional structures 200 depending on the application in which the additional structures 200 and the array 250 are used. Further, the additional structures 200 may be insertable or nestable with respect to the structures 200 in the array 250, meaning that the upper end 220 of one structure 200 is in the array 250 is insertable into the lower end 220 of one of the additional structures 200. Moreover, the structures 200 may be joined or attached to each other. For example they may be welded to each other, for example, via Rf welding, depending on the material from which they are made.

Figure 3E:
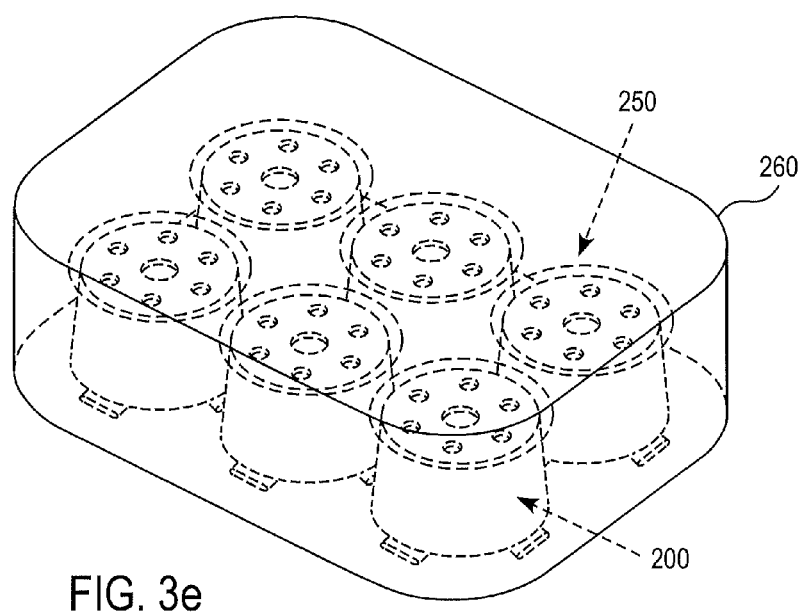
Figure 3F:
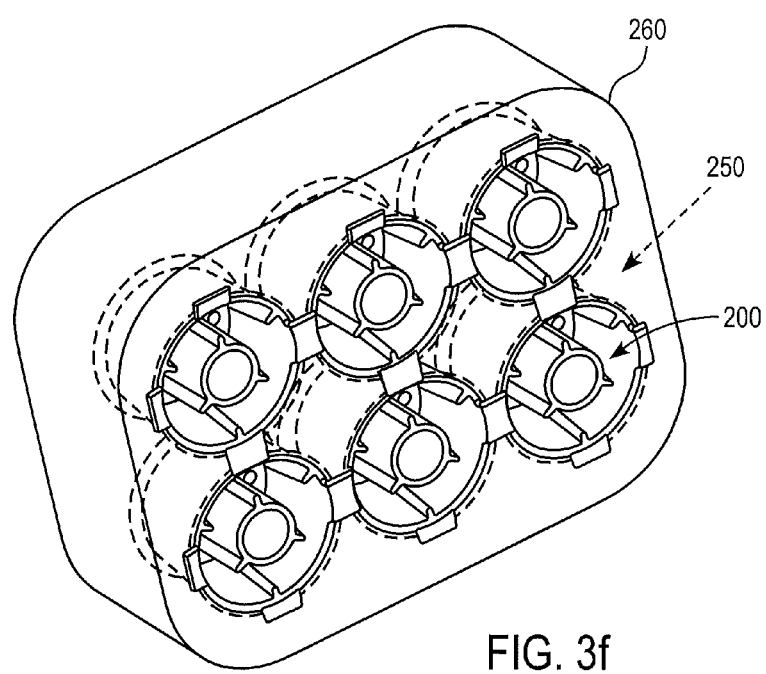

The array 200 may be used as an independent liner material or utilized in a liner assembly. In the embodiments shown in FIGS. 3e and 3f, the array 250 is enveloped in a padding 260. The padding 260 may be of the types disclosed in U.S. Pat. No. 7,341,776 or U.S. Patent Application Publication No. 2007/0281125 A1, for example, the disclosures of which are incorporated herein by reference. A portion of the structures 200 in the array 250 may (or may not) be exposed through the padding 260 a shown in FIG. 3e. In some embodiment's, the array 250 is completely enveloped in the padding 260. Alternatively, the array 250 may be enveloped in a foam, adjacent to a soft comfort layer, encapsulated by PU film, wicking fabric, and hook or loop fabric so as to be incorporated into a helmet pad assembly. In these embodiments, the array 250 of energy management structures 200 reinforces the padding 260 or alternative materials while allowing the pad assembly to easily conform to the curvature of the helmet shell. The padding 260 may include attachment devices, such as a hook and loop fastening system or reusable adhesive, to detachably attach the padding 260 to portions of body protective gear subject to impact forces.

Figure 4A:
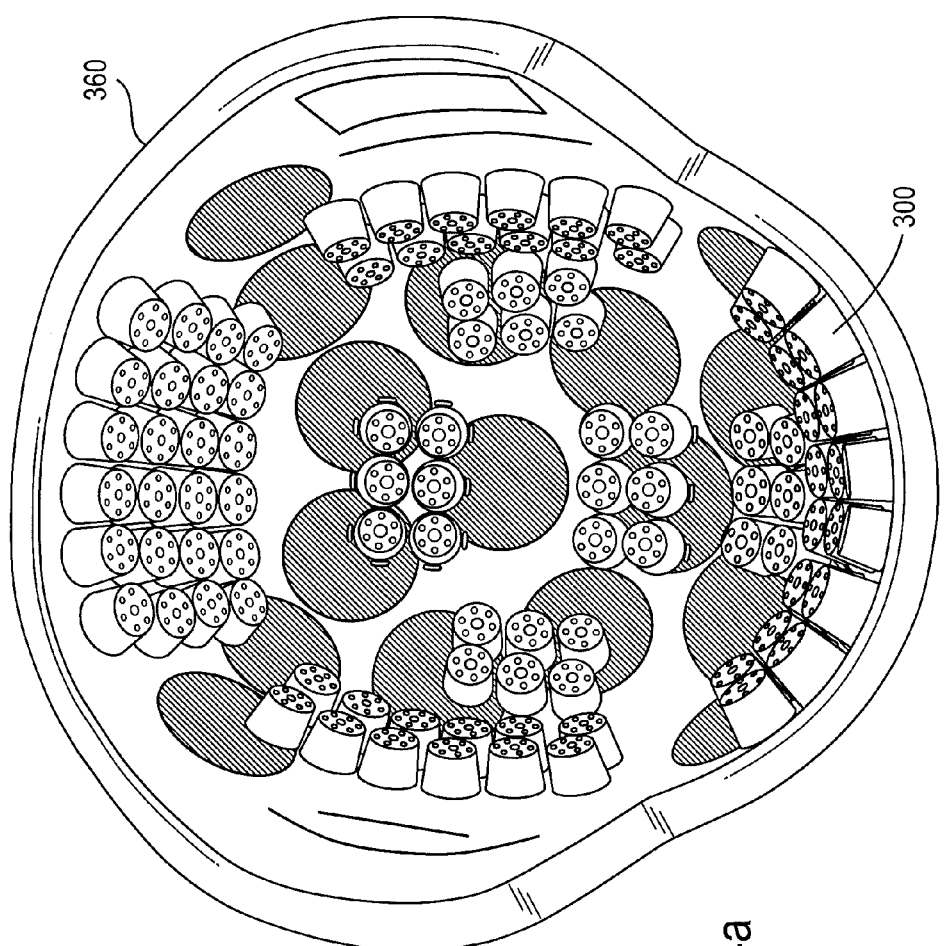
FIG. 4a is a perspective view of a helmet including a plurality of energy management structures.

According to a further embodiments, the energy management structure 300 is adapted to be attached to the inside of a helmet 360 as shown in FIG. 4a. The structure 300 comprises a first component 102 possessing a compressive response profile having a buckling/bending profile characteristic such that the first component 102 buckles and then bends when the force is applied to the energy management structure 300, and a second component 104 surrounding the first component 102 (or vice versa) and possessing a compressive response profile having a bending/buckling profile characteristic such that the second component 104 begins to bend or buckle when the first component 102 transitions from buckling to bending. As discussed above, it is also possible, however, to manipulate the timing of the bending/buckling of the second component 104 relative to the first component 102 by (i) increasing/decreasing the wall thickness of the second component 104 relative to the wall thickness of the first component 102, (ii) enlarging/reducing the recess 108 between the first component 102 and the second component 104 so that the first component 102 is farther/closer to the second component 304, and/or (iii) eliminating the offset 118, or changing the height of the offset 118 (including changing the height of one offset 118 relative to the height of another offset 118). The structure 300 also includes a third component 106 connecting the first 102 component to the second component 104. The structure 300 may be configured according to any of the embodiments discussed above with respect to the energy management structure 100 and the array 250 of the energy management structures 200. As shown in FIG. 4a, the lower end 122 of the structure 300 is adapted to be facing the shell of the helmet 360, and the upper end 120 of the structure is adapted to be facing the head of the helmet wearer. In the embodiment, the part of the structure 200 facing the helmet 360 includes a low-friction boundary with the helmet 360 so as to permit rotation of the helmet 360 on the head of the wearer when an impact force is applied to the helmet 360.

Figure 4B:
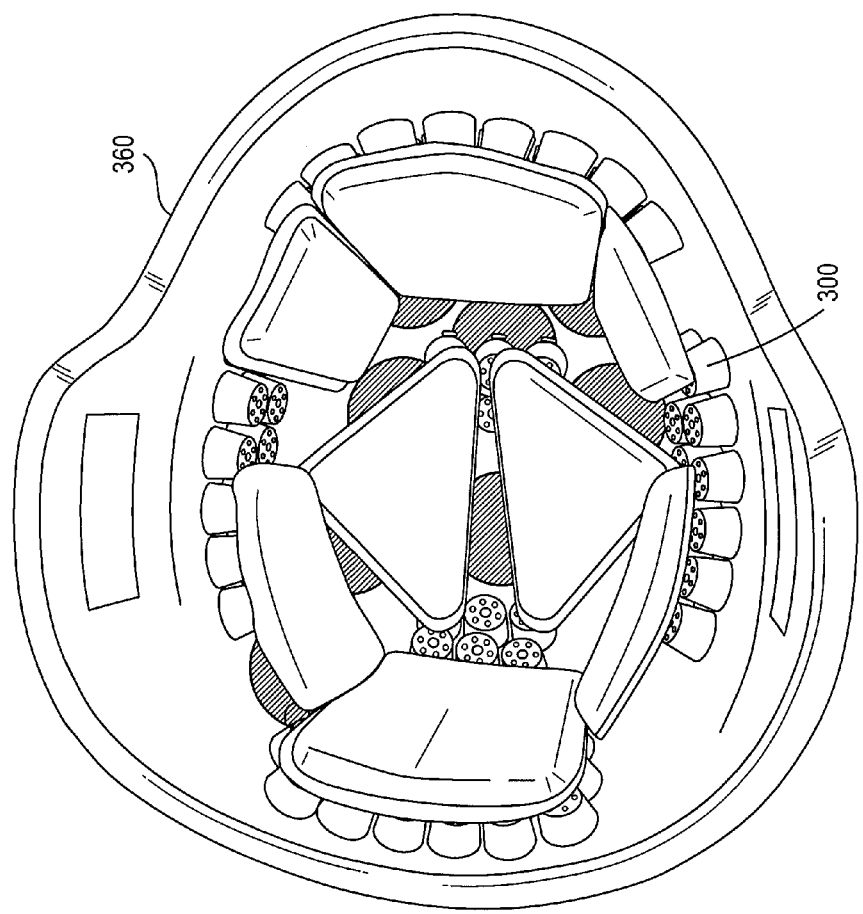
FIG. 4b is a perspective view of a helmet including a plurality of energy management structures used with a padding.

According to some embodiments, the structure 300 or array of structures 300 is detachably attachable to the helmet 360, so that the structure 300 is detachable from one location on the helmet 360 and re-attachable to another location on the helmet 360. The manner in which the structure 300 is detachably attached to the helmet 360 is not particularly limited. For example, the structure 300 is detachably attached to the helmet 360 via a hook and loop fastening system or a reusable or re-appliable adhesive. In addition, as shown in FIG. 4b, the structures 300 may accompanied in the helmet 360 with a padding of the type disclosed in U.S. Pat. No. 7,341,776 or U.S. Patent Application Publication No. 2007/0281125 A1, the disclosures of which are incorporated herein by reference.

Because the structures 300 are detachably attachable to the helmet 360, a user or supplier can selectively distribute the structures 300 to a desired location on the helmet 360. As different regions of the shell of the helmet 360 require varying ideal stiffness, the structures 300 may be strategically placed on the helmet 360 to yield an ideal stiffness per shell location. For instance, a helmet 360 with a relatively stiff shell may need a substantially "softer" array of structures 300 for large flat regions such as on the side above the ear. A comparably stiffer array of structures 300 is more suitable for regions on the shell in front of the forehead, which may utilize a much smaller area of energy management structures 300. The reattachability of the structures 300 on the helmet 360 offers convenient regional tuning of the structure configuration by spacing the structures 300 as desired without the need for complex molds as conventionally required for typical multi-density foam helmet liners. The spacing of the structures 300 may also contribute to the smoothness of the compression response characteristic stress/strain curve discussed above for the overall structure and for particular impact events.

The above discussion is applicable to a method of designing an energy management system for a helmet. Such a method includes selectively distributing at least one energy management structure 300 to a desired location on the helmet 360.

FIGS. 5a-5d illustrate different views of another embodiment of the energy management structure 100. The energy management structure 100 in this embodiment may be configured according to any of the embodiments discussed above with respect to the energy management structure 100, and further includes a fourth component 524 between the first component 102 and the second component 104, and is also connected to the third component 106. In the embodiment, the fourth component 524 comprises two walls 526, 528, one of the walls surrounding the other wall. The fourth component 524 possesses a third compressive response profile that may be additive to the first and second compressive response profiles in the same manner as discussed above to result in an overall compressive response profile of the energy management structure 100 that meets a desired design compressive response profile. In further, embodiments, the energy management structure 100 may include additional components similar to fourth component 524 depending on the application in which the structure 100 is to be used.

Figure 6B:
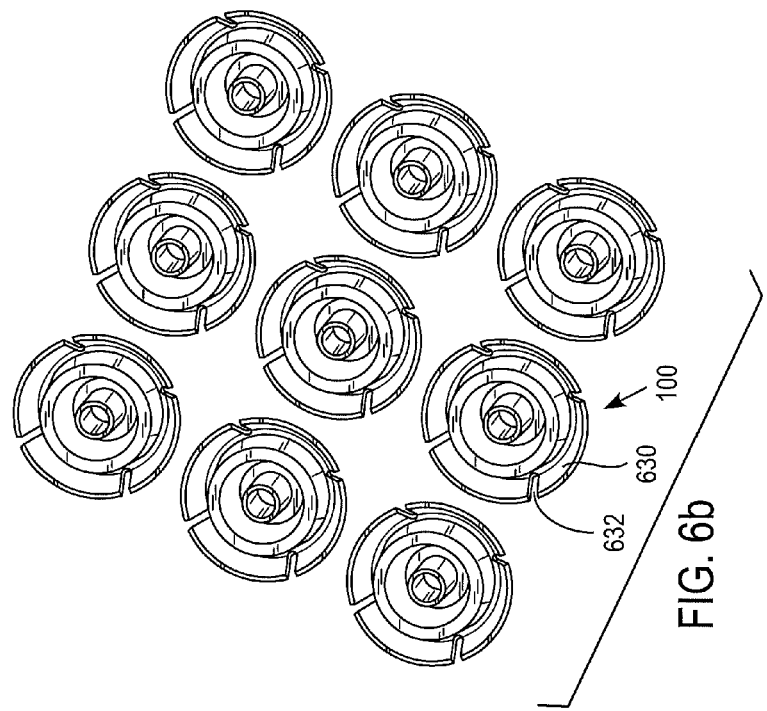
FIGS. 6a and 6b illustrate different views of a modified embodiment of the energy management structure shown in FIGS. 5a-5d.
Figure 6A:
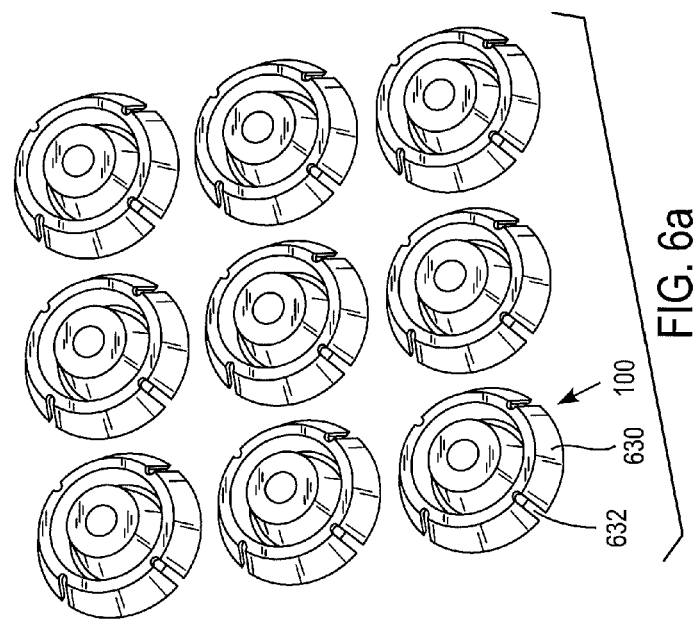
Figure 7C:
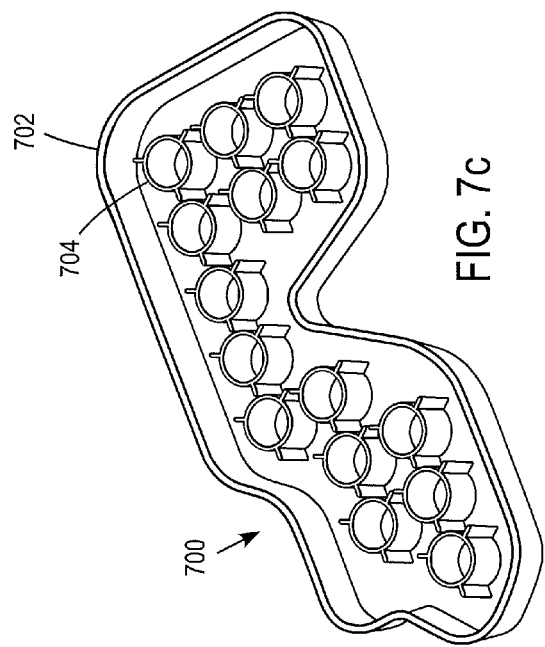
FIGS. 7a-7d illustrate different views of a further embodiment of the energy management structure.
Figure 7D:
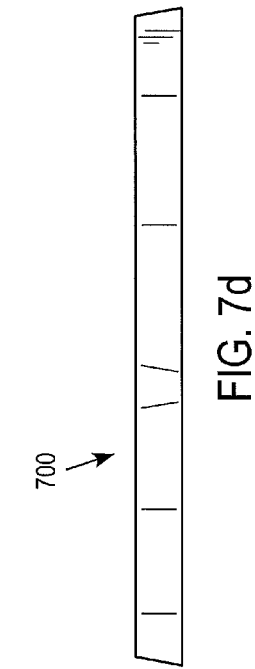
Figure 7A:
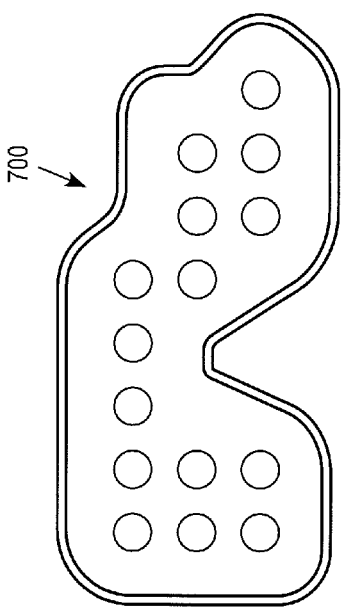
Figure 7B:
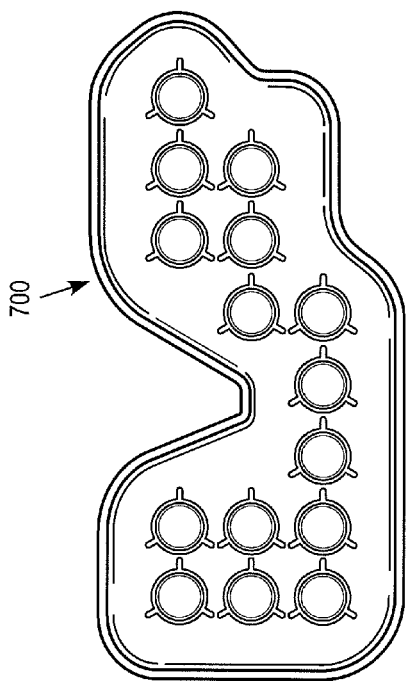

FIGS. 6a and 6b illustrate a modified embodiment of the energy management structure 100 shown in FIGS. 5a-5d. The energy management structure 100 in this modified embodiment may be configured according to any of the embodiments discussed above with respect to the energy management structure 100. In addition, the second component 104 here comprises walls 630 that are separated from each other by gaps 632 between the walls 630. These gaps 632 may extend into the third component 106 as shown in FIGS. 6a and 6b. The gaps 632 between the walls 630 of the second component 104 may be used to affect (e.g., decrease) the stiffness of the second component 104, thus manipulating the compressive response profile of the second component 104 as desired.

FIGS. 7a-7d illustrate a further embodiment of the energy management structure, designated with reference numeral 700. The energy management structure 700 in this modified embodiment may include the features discussed above with respect to the energy management structure 100. In this embodiment, the energy management structure 700 comprises a plurality of first components 702 surrounded by a second component 704. Each of the plurality of first components 702 possesses a respective compressive response profile as discussed above. That is, each first component 702 possesses a compressive response profile having a buckling/bending profile characteristic such that the first component 702 buckles and then bends when the force is applied to the energy management structure 700. The second component 704 surrounding the plurality of first components 702 possesses a compressive response profile having a bending/buckling profile characteristic such that the second component 704 begins to bend or buckle when one or more of the first components 702 transitions from buckling to bending. Alternatively, the energy management structure 700 be configured such that the second component 704 possesses a compressive response profile having a buckling/bending profile characteristic such that the second component 704 buckles and then bends when the force is applied to the energy management structure 700, and one or more of the first components 702 possesses a compressive response profile having a bending/buckling profile characteristic such that one or more of the first components 702 begins to bend or buckle when the second component 704 transitions from buckling to bending. Accordingly, the energy management structure 700 may possess an overall compression response characteristic that is defined by a smooth curve as discussed above with respect to the other embodiments.

As shown in FIGS. 7a-7d, the height of the second component 704 may be the same as the height of each of the plurality of first components 702. Alternatively, however, the height of the second component 704 may be the same as the height of some of the plurality of first components 702, such that the height of other of the of the plurality of first components 702 is different than that of the second component 704. The difference in height, or lack thereof may affect the overall compression response characteristic of the energy management structure 700 to suite the overall compressive response profile to desired applications.

FIGS. 8a-8d illustrate different views of another embodiment of the energy management structure, designated with reference numeral 800. The energy management structure 800 in this modified embodiment is somewhat similar to the energy management structure 700 in that the energy management structure 800 comprises a plurality of first components 802 surrounded by a second component 804, and may include the features discussed above with respect to the energy management structure 100. In the energy management structure 800, each of the plurality of first components 802 comprises a substructure 840 having at least one wall 842 surrounded by another wall 844. As shown in FIGS. 8a and 8b, the wall 844 is concentric to the wall 842. The substructure 840 may include one or more additional concentric walls, such as wall 843 shown in FIGS. 8a and 8b.

According to the embodiment, the wall 842 comprises a first subcomponent possessing a first compressive response profile, and the wall 844 comprises a second subcomponent possessing a second compressive response profile different from the first compressive response profile. The first and second compressive response profiles are similar to those discussed above. That is, when a force is applied to the energy management structure 800 and/or the substructure 840, the second compressive response profile of the second subcomponent 844 is additive to the first compressive response profile of the first subcomponent 842 to result in an compressive response profile of the substructure 840 that meets a design compressive response profile of the substructure 840. Moreover, each substructure 840 of the energy management structure 800 provides the respective first component 802 with a compressive response profile different from the compressive response profile of the second component 804. In this regard, ach first component 802 (substructure 840) possesses a compressive response profile having a buckling/bending profile characteristic such that the first component 802 (substructure 840) buckles and then bends when the force is applied to the energy management structure 800. The second component 804 surrounding the plurality of first components 802 (substructures 840) possesses a compressive response profile having a bending/buckling profile characteristic such that the second component 804 begins to bend or buckle when one or more of the first components 802 (substructures 840) transitions from buckling to bending. Alternatively, the energy management structure 800 be configured such that the second component 804 possesses a compressive response profile having a buckling/bending profile characteristic such that the second component 804 buckles and then bends when the force is applied to the energy management structure 800, and one or more of the first components 802 (substructures 840) possesses a compressive response profile having a bending/buckling profile characteristic such that one or more of the first components 802 (substructures 840) begins to bend or buckle when the second component 804 transitions from buckling to bending. Accordingly, the energy management structure 800 may possess an overall compression response characteristic that is defined by a smooth curve as discussed above with respect to the other embodiments.

As shown in FIG. 8d, the height of the second component 804 may be shorter than the height of the plurality of first components 802. Alternatively, however, the height of the second component 804 may be the same as the height of one or more of the plurality of first components 802. The difference in height, or lack thereof may affect the overall compression response characteristic of the energy management structure 800 to suite the overall compressive response profile to desired applications.

Figure 9:
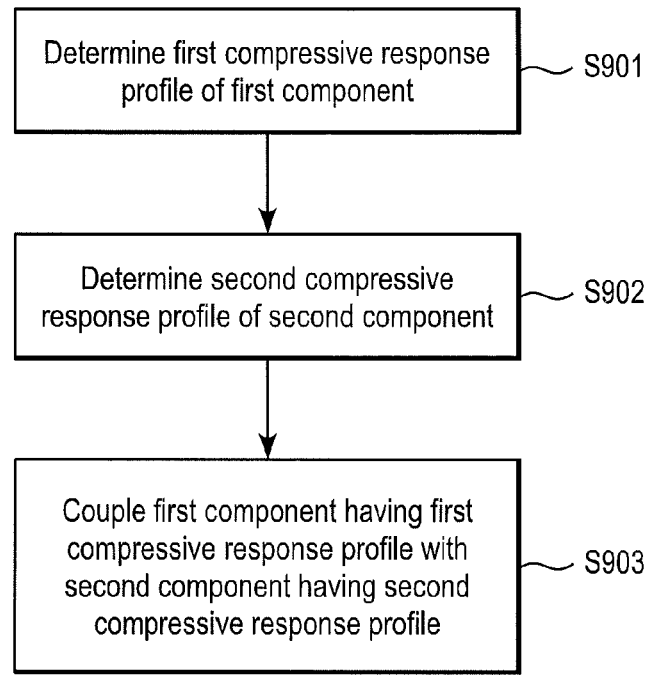
FIG. 9 illustrates the steps associated with a method of designing an energy management structure.

FIG. 9 illustrates a method of designing an energy management structure in connection with the above embodiments. The method comprises a first step S901 of determining a first compressive response profile of the first component 102, and a second step S902 of determining a second compressive response profile of the second component 104. The second compressive response profile is different from the first compressive response profile. In step S903, the energy management structure 100 is designed by coupling at least one first component 102 having the first compressive response profile with at least one second component 104 having the second compressive response profile to result in an overall compressive response profile of the energy management structure 100 that meets a design compressive response profile. These steps may be carried out in a specifically programmed computer executing code to carry out the steps. The computer may be a conventional computer having all of the components necessary, as would be understood by one skilled in the art, to execute the above steps. As discussed above, at least one of the first compressive response profile and the second compressive response profile may be erratic, while the overall design compressive response profile of the energy management structure 100 is smooth. That is, the overall design compressive response profile is defined by a smooth curve on a graph showing a stress/strain relationship of the structure in response to an applied force.

Figure 10:
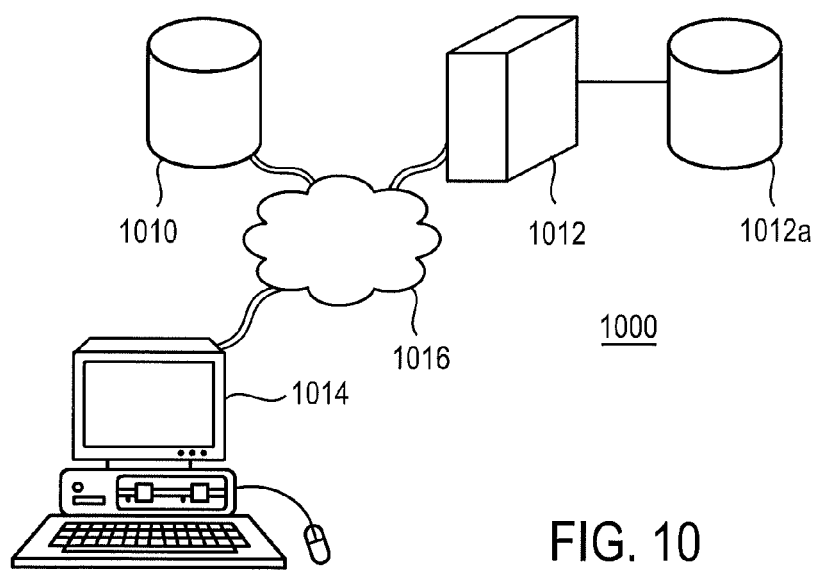
FIG. 10 shows one embodiment of a computer system for carrying out the process shown in FIG. 9.

FIG. 10 shows an exemplary computer system 1000 for carrying out the process shown in FIG. 9, for example. The system 1000 has a computer 1014, which may be a dedicated, specific purpose computer, or a specifically programmed general purpose computer. The computer 1014 can have a database of various materials and structures collated with their compression response profiles. Alternatively or additionally, the computer 1014, via a network 1016, can access other databases 1010 or servers 1012 operatively connected to databases 1012a that have this form of data. The data can be empirically derived through testing, or by computer modeling and/or simulation. The computer 1014 has input devices (e.g., keyboard and mouse) for inputting an energy management system/structure design compression profile. The user can then select materials and structures whose compression profiles add up to the overall design compression profile, or the computer can propose combinations based on known computer modeling and simulation techniques (e.g., finite element analysis), or simple algebraically additive graphing techniques that use best-fit graphic techniques to select additive compression profiles for two, three or more components that suggest the additive result will be the design compression profile, and output a suggested design or design according to predetermined criteria.

The energy management structures have been described herein primarily in connection with a helmet for military, athletic and recreational activities where a chance of cranial impact is possible. However, the described energy management structures are also applicable to body protective gear including a vest, arm/elbow pads, leg/knee pads and footwear. Additionally, the energy management structures may be configured for larger scale applications, such as padding for packages, floors and floor mats, boat decking, and walls and foundations of buildings, in which sheets of the arrays of the energy management structures that are designed for particular environments can be provided for installation by the buyer or installer.

While the energy management structures have been described with reference to preferred embodiments thereof, it is to be understood that the energy management structures are not limited to the preferred embodiments or constructions. The disclosed energy management structures are intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An energy management structure adapted to absorb a force applied thereto, the structure comprising: a first component possessing a first compressive response profile; a second component surrounding the first component and possessing a second compressive response profile different and independent from the first compressive response profile; and a third component connecting the first component to the second component; wherein both the first and second components comprise at least one continuous wall that forms a hollow part, wherein an inner surface of the continuous wall of the second component surrounds at least a portion of an outer surface of the continuous wall of the first component and no portion of the continuous wall of the second component touches the continuous wall of the first component; wherein a recess is present between the first component and the second component and is formed by the first, second and third components; and wherein upon application of a force, the second compressive response profile of the second component is additive to the first compressive response profile of the first component to result in an overall compressive response profile of the energy management structure.

2. The energy management structure according to claim 1, wherein at least one of the first compressive response profile and the second compressive response profile is erratic, and the overall compressive response profile is smooth.

3. The energy management structure according to claim 1, wherein the overall compressive response profile is defined by a smooth curve on a graph showing a stress/strain relationship of the structure in response to an applied force.

4. The energy management structure according to claim 3, wherein smoothness of the curve is based on the first component of the structure buckling and then bending when the force is applied to the structure, and the second component, surrounding the first component, beginning to bend or buckle when the first component transitions from bending to buckling.

5. The energy management structure according to claim 1, wherein the first compressive response profile possesses a compression profile characteristic that shows a transition point in compression resistance from a relatively high compression resistance to a relatively low compression resistance of the first component when a force is applied to the energy management structure; and the second compressive response profile possesses a compression profile characteristic that is additive to the compression profile characteristic of the first component at the transition point when the force is applied to the second component.

6. The energy management structure according to claim 1, wherein the first compressive response profile possesses a buckling/bending profile characteristic such that the first component buckles and then bends when the force is applied to the energy management structure; and the second compressive response profile possesses a bending/buckling profile characteristic such that the second component begins to bend or buckle when the first component transitions form buckling to bending.

7. The energy management structure according to claim 1, wherein the third component is provided at one of an upper and lower end of the structure.

8. The energy management structure according to claim 1, wherein the first component is a center column extending from one end of the structure to an opposing end of the structure.

9. The energy management structure according to claim 1, wherein the first component includes at least one reinforcing rib on a side of the first component facing the second component.

10. The energy management structure according to claim 1, wherein the first component is corrugated, so that the first component has a wavy cross-sectional profile.

11. The energy management structure according to claim 1, wherein the second component includes at least one reinforcing rib.

12. The energy management structure according to claim 1, wherein the third component includes at least one aperture.

13. The energy management structure according to claim 12, wherein the aperture opens into the hollow part of the first component.

14. The energy management structure according to claim 1, wherein one end of the first component extends to one end of the structure, and one end of the second component extends toward the one end of the structure and is offset from the one end of the first component, such that the second component does not extend as far as the one end of the first component.

15. The energy management structure according to claim 14, wherein the size of the offset of the one end of the second component relative to the one end of the first component is about 10% of the total height of the structure.

16. The energy management structure according to claim 1, wherein the structure has a frusta-conical shape.

17. The energy management structure according to claim 1, wherein the structure has a cylindrical shape.

18. The energy management structure according to claim 1, wherein the structure has a mushroom shape.

19. The energy management structure according to claim 1, wherein the structure is formed of a polymer material.

20. The energy management structure according to claim 1, wherein the structure is formed of thermoplastic elastomer.

21. The energy management structure according to claim 1, wherein the structure is formed of an injection-molded material.

22. The energy management structure according to claim 1, wherein the structure is configured to elastically deform in an axial direction of the structure when a force is applied to the structure.

23. The energy management structure according to claim 1, wherein the structure is configured to plastically deform in an axial direction of the structure when a force is applied to the structure.

24. The energy management structure according to claim 1, wherein the structure is crushable to about 30% of its original size.

25. The energy management structure according to claim 1, wherein the structure is crushable to about 20% of its original size.

26. The energy management structure according to claim 1, wherein the structure is crushable to about 10% of its original size.

27. An array of energy management structures according to claim 1.

28. The array according to claim 27, wherein the structures in the array are connected to each other with a connector attached to a lower end portion of adjacent structures.

29. The array according to claim 27, wherein the structures in the array are identical.

30. The array according to claim 27, wherein the structures in the array are stackable on top of each other.

31. The array according to claim 27, wherein the array is enveloped in a padding.

32. An energy management structure according to claim 1 adapted to be attached to an inside of a helmet.

33. The energy management structure according to claim 32, wherein the structure is detachably attachable to the helmet, so that the structure is detachable from one location on the helmet and reattachable to another location on the helmet.

34. A helmet including at least one energy management structure according to claim 1.

35. A method of designing an energy management system for body protective gear, the energy management system comprising at least one energy management structure of claim 1, the method comprising selectively distributing the at least one energy management structure to a desired location on the body protective gear.

36. The energy management structure of claim 1, wherein the at least one continuous wall of both the first and second components extends from the third component to an open end.

37. The energy management structure according to claim 1, wherein a distal end of the second component extends to one end of the structure, and wherein a distal end of the first component extends toward the one end of the structure and is offset from the distal end of the second component such that the first component does not extend as far as the distal end of the second component.

38. An energy management structure comprising a first component, a second component surrounding the first component, and a third component connecting the first component to the second component; wherein both the first and second components comprise at least one continuous wall that forms a hollow part, wherein an inner surface of the continuous wall of the second component surrounds at least a portion of an outer surface of the continuous wall of the first component and no portion of the continuous wall of the second component touches the continuous wall of the first component; and wherein a recess is formed by the first, second and third components.

39. The energy management structure according to claim 38, wherein the energy management structure is a polymer structure made from a single piece of material.

40. The energy management structure according to claim 38, wherein the second component concentrically surrounds the first component.

41. The energy management structure according to claim 38, wherein the third component comprises an aperture opening into the hollow part of the first component.

42. The energy management structure according to claim 38, wherein both the first and second components comprise a single continuous wall that forms a circular column.

43. The energy management structure according to claim 38, wherein the first component has a frusta-conical shape.

44. The energy management structure according to claim 38, wherein the second component has a cylindrical shape.

45. The energy management structure according to claim 38, wherein the at least one continuous wall of both the first and second components extends from the third component to an open end.

46. The energy management structure according to claim 38, wherein a distal end of the second component extends to one end of the structure, and wherein a distal end of the first component extends toward the one end of the structure and is offset from the distal end of the second component such that the first component does not extend as far as the distal end of the second component.

47. The energy management structure according to claim 38, wherein at least the first and second components are configured to buckle in response to a force applied to the structure.

48. A helmet comprising a helmet shell and at least one energy management structure according to claim 38 attached to an inside of the helmet shell.

49. An energy management structure adapted to absorb a force applied thereto, the structure comprising: a first component possessing a first compressive response profile; a second component surrounding the first component and possessing a second compressive response profile different from the first compressive response profile; a third component connecting the first component to the second component; and a fourth component between the first and second components and connected to the third component, the fourth component possessing a third compressive response profile; wherein both the first and second components comprise at least one continuous wall that forms a hollow part; wherein a recess is present between the first component and the second component and is formed by the first, second and third components; and wherein upon application of a force, the second compressive response profile of the second component is additive to the first compressive response profile of the first component to result in an overall compressive response profile of the energy management structure.

50. The energy management structure according to claim 49, wherein the fourth component comprises two walls, one of the walls surrounding the other of the walls.

51. The energy management structure according to claim 49, wherein the second component is an outermost component and comprises walls that are separated from each other by gaps between the walls.

52. The energy management structure according to claim 51, wherein the gaps extend into the third component.

53. An energy management structure adapted to absorb a force applied thereto, the structure comprising: a plurality of first components, each of the plurality of first components possessing a respective compressive response profile; a second component surrounding the plurality of first components and possessing a second compressive response profile different from the compressive response profiles of the plurality of first components; and a third component connecting at least one of the plurality of first components to the second component; wherein the at least one of the plurality of first components and the second component each comprise at least one continuous wall that forms a hollow part; wherein a recess is present between the at least one of the plurality of first components and the second component and is formed by the at least one of the plurality of first components, second component and third component; and wherein upon application of a force, the second compressive response profile of the second component is additive to the compressive response profiles of the plurality of first components to result in an overall compressive response profile of the energy management structure.

54. The energy management structure according to claim 53, wherein a height of the second component is the same as the height of each of the plurality of first components.

55. The energy management structure according to claim 53, wherein a height of the second component is the same as the height of some of the plurality of first components, such that the height of other of the plurality of first components is different than that of the second component.

56. The energy management structure according to claim 53, wherein the each of the plurality of first components comprises a substructure having at least one wall surrounded by another wall.

57. The energy management structure according to claim 56, wherein at least one of the walls of the substructure is concentric to another wall of the substructure.

58. The energy management structure according to claim 57, wherein each of the plurality of substructures comprises: a first subcomponent possessing a first compressive response profile; a second subcomponent possessing a second compressive response profile different from the first compressive response profile; and upon application of a force, the second compressive response profile of the second subcomponent is additive to the first compressive response profile of the first subcomponent to result in an compressive response profile of the substructure that meets a design compressive response profile.

59. The energy management structure according to claim 56, wherein a height of the second component is the same as the height of each of the plurality of substructures.

60. The energy management structure according to claim 56, wherein a height of the second component is different than the height of the plurality of substructures.

\* \* \* \* \*